(12) United States Patent
Kim et al.

(10) Patent No.: US 7,307,014 B2
(45) Date of Patent: Dec. 11, 2007

(54) METHOD OF FORMING A VIA CONTACT STRUCTURE USING A DUAL DAMASCENE PROCESS

(75) Inventors: Jae-Hak Kim, Seoul (KR); Kyoung-Woo Lee, Seoul (KR); Hong-Jae Shin, Seoul (KR); Young-Joon Moon, Seoul (KR); Seo-Woo Nam, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 371 days.

(21) Appl. No.: 11/099,534

(22) Filed: Apr. 6, 2005

(65) Prior Publication Data
US 2006/0003574 A1    Jan. 5, 2006

(30) Foreign Application Priority Data
Jul. 5, 2004    (KR) ...................... 10-2004-0052056

(51) Int. Cl.
*H01L 21/4763* (2006.01)
(52) U.S. Cl. ...................... 438/637; 438/638; 438/700; 438/703; 257/E21.232; 257/E23.145; 257/E21.579

(58) Field of Classification Search ................ 438/637, 438/638, 700, 703; 257/E21.232, E23.145, 257/E21.579
See application file for complete search history.

(56) References Cited

U.S. PATENT DOCUMENTS

| | | | |
|---|---|---|---|
| 6,297,149 B1 | 10/2001 | Stamper | |
| 6,461,955 B1 | 10/2002 | Tsu et al. | |
| 2006/0216926 A1* | 9/2006 | Ye et al. ...................... | 438/629 |

FOREIGN PATENT DOCUMENTS

| | | |
|---|---|---|
| JP | 11-274299 | 10/1999 |
| KR | 1020030044338 A | 6/2003 |

* cited by examiner

*Primary Examiner*—George Fourson
*Assistant Examiner*—Julio J. Maldonado
(74) *Attorney, Agent, or Firm*—Volentine & Whitt, PLLC

(57) ABSTRACT

A method of forming a via contact structure using a dual damascene process is disclosed. According to one embodiment a sacrificial layer is formed on an insulating interlayer during the formation of a preliminary via hole. The sacrificial layer has the same composition as a layer filling the preliminary via hole in a subsequent trench formation process. The sacrificial layer and the layer filling the preliminary via hole are simultaneously removed after the trench formation process is carried out. According to another embodiment, a thin capping oxide layer is formed on an insulating interlayer during the formation of a preliminary via hole. The thin capping oxide layer is removed together with a sacrificial layer after a trench formation process is carried out.

26 Claims, 21 Drawing Sheets

METHOD OF FORMING A VIA CONTACT STRUCTURE USING A DUAL DAMASCENE PROCESS

BACKGROUND OF THE INVENTION

1. Field of the Invention

The present invention relates generally to a method of fabricating a semiconductor device and, more particularly, to a method of forming a via contact structure using a dual damascene process.

A claim of priority is made to Korean Patent Application No. 10-2004-0052056, filed on Jul. 5, 2004, the disclosure of which is incorporated herein by reference in its entirety.

2. Description of the Related Art

As semiconductor devices become increasingly integrated, a metallization process stands out as a factor limiting the performance and reliability of the semiconductor devices. In particular, the metallization process often contributes to resistance-capacitance (RC) delay and electromigration (EM) problems. In order to address these problems, a copper interconnection and a low-k dielectric layer are commonly applied to the semiconductor device, and a damascene process is used to form the copper interconnection.

The damascene process is widely used to form an upper metal interconnection which is electrically connected to a lower metal interconnection. The upper metal interconnection fills a via hole and a trench region which are formed in an inter-metal dielectric layer. The via hole is formed to expose a predetermined region of the lower metal interconnection, and the trench is formed to have a line-shaped groove spanning the via hole. Accordingly, the via hole and the trench are formed by two separate etching processes. Such a damascene process is called a dual damascene process.

FIGS. 1A to 1F are cross-sectional views illustrating a conventional method of forming a via contact structure.

Referring to FIG. 1A, a lower insulating layer 10 is formed on a semiconductor substrate 5. A damascene process is used to form a lower interconnection 12 in lower insulating layer 10. Lower interconnection 12 is typically formed of a copper layer or a tungsten layer.

An etch stop layer 15 and an insulating interlayer 17 are sequentially formed on lower insulating layer 10 and lower interconnection 12. Etch stop layer 15 is formed of a silicon nitride layer. Insulating interlayer 17 is formed of a single low-k dielectric layer in order to enhance an operating speed of the semiconductor device and to prevent an interface from forming in insulating interlayer 17. The single low-k dielectric layer is typically formed of a silicon oxide layer containing carbon, fluorine or hydrogen. For example, the low-k dielectric layer commonly comprises a SiOC layer, a SiOCH layer or a SiOF layer.

Insulating interlayer 17 is often damaged during a subsequent fabrication process, thereby degrading its low-k dielectric characteristics. Accordingly, a capping oxide layer 20 is formed on insulating interlayer 17 in order to protect the electrical characteristics thereof. Capping oxide layer 20 is typically formed of a tetra ethyl orthosilicate (TEOS) layer or an undoped silicate glass (USG) layer. The surface of insulating interlayer 17 is typically altered by the formation of capping oxide layer 20 in an oxygen gas atmosphere, leaving an interface layer 17a during the formation of capping oxide layer 20. Where insulating interlayer 17 is formed of a SiOC layer, oxygen gas from capping oxide layer 20 reacts with carbon in the SiOC layer, thereby producing $CO_2$ gas. This creates interface layer 17a, which is not densely formed.

Capping oxide layer 20, interface layer 17a, and insulating interlayer 17 are sequentially patterned to form a preliminary via hole 25 exposing a portion of etch stop layer 15 on lower interconnection 12.

Referring to FIG. 1B, a sacrificial layer 30 filling preliminary via hole 25 is formed on the semiconductor substrate having preliminary via hole 25. Sacrificial layer 30 is formed of a layer having a wet etch selectivity relative to insulating interlayer 17. Sacrificial layer 30 is formed in order to prevent preliminary via hole 25 from being deformed in a subsequent process.

Referring to FIG. 1C, sacrificial layer 30, capping oxide layer 20, interface layer 17a, and insulating interlayer 17 are sequentially patterned by photolithography and etching processes to form a trench region 35 spanning preliminary via hole 25. Following the formation of trench region 35, a sacrificial layer 30a remains in preliminary via hole 25.

Referring to FIG. 1D, sacrificial layer 30a in preliminary via hole 25 and sacrificial layer 30 on insulating interlayer 17 are removed. Sacrificial layers 30 and 30a are removed using a wet etch solution. As a result, the portion of etch stop layer 15 is exposed. Sacrificial layer 30a has a wet etch selectivity relative to insulating interlayer 17, thus preventing the surface of insulating interlayer 17 from being etched. However, due to certain characteristics of interface layer 17a, which is not densely formed, interface layer 17a is also etched in the process of wet etching sacrificial layers 30 and 30a. As a result, an undercut defect "A" occurs below capping oxide layer 20. Where undercut defect "A" is severe, interface layer 17a is often completely etched, thereby creating a region "B" where capping oxide layer 20 is completely removed.

Referring to FIG. 1E, the portion of etch stop layer 15 is removed to form a final via hole 25a exposing lower interconnection 12. Etch stop layer 15 is removed by dry etching. A portion of insulating interlayer 17 is also commonly etched in the process of etching etch stop layer 15. In particular, partial etching is typically carried out below where undercut defect "A" has occurred, thereby forming an extended undercut defect "A1".

Referring to FIG. 1F, an upper metal layer is formed on the semiconductor substrate having final via hole 25a. The upper metal layer is generally formed by sequentially forming a barrier metal layer 40 and a metal layer 45. Barrier metal layer 40 is typically formed of a TaN layer or a TiN layer, and metal layer 45 is typically formed of a copper layer. Metal layer 45 is formed as follows. A copper (Cu) seed layer 42 is first formed on barrier metal layer 40 using a sputtering method and copper seed layer 42 is used to form metal layer 45 using a plating method. Because copper seed layer 42 is formed using the sputtering method, copper seed layer 42 is not formed where extended undercut defect "A1" has occurred. Thus, where metal layer 45 is formed using the plating method, a void defect "C" commonly occurs near extended undercut defect "A1" due to the fact that copper seed layer 42 did not properly form at that location. Void defect "C", causes the resistance of a contact structure to increase.

What is needed, therefore, is a method of forming a via contact structure which is capable of preventing undercut defect "A1" and void defect "C" from occurring.

SUMMARY OF THE INVENTION

Embodiments of the present invention provide a method of forming a via contact structure which may ensure stabilized sidewall profiles of a trench region and a via hole for burying a metal without any voids.

According to one embodiment of the present invention, a method of forming a via contact structure is provided. The method comprises forming a lower interconnection on a semiconductor substrate, sequentially forming an etch stop layer, an insulating interlayer, and a first sacrificial layer on the semiconductor substrate, and sequentially patterning the first sacrificial layer and the insulating interlayer to form a preliminary via hole exposing a portion of the etch stop layer on the lower interconnection. The method further comprises forming a second sacrificial layer on the semiconductor substrate, the second sacrificial layer filling the preliminary via hole, and sequentially patterning the second sacrificial layer, the first sacrificial layer, and the insulating interlayer to form a trench region spanning the preliminary via hole. The method still further comprises simultaneously removing the first and second sacrificial layers using a wet etching process after forming the trench region, thereby exposing the portion of the etch stop layer and etching the exposed portion of the etch stop layer, thereby exposing the lower interconnection.

Typically, a plasma treatment is carried out before or after forming the first sacrificial layer or the second sacrificial layer. Also, the first sacrificial layer is often removed after the preliminary via hole is formed.

According to another embodiment of the present invention, a method of forming a via contact structure is provided. The method comprises forming a lower interconnection on a semiconductor substrate, sequentially forming an etch stop layer, an insulating interlayer, and a capping oxide layer on the semiconductor substrate, and sequentially patterning the capping oxide layer and the insulating interlayer to form a preliminary via hole exposing a portion of the etch stop layer on the lower interconnection. The method further comprises forming a sacrificial layer on the semiconductor substrate, the sacrificial layer filling the preliminary via hole, and sequentially patterning the sacrificial layer, the capping oxide layer, and the insulating interlayer to form a trench region spanning the preliminary via hole. The method still further comprises simultaneously removing the capping oxide layer and the sacrificial layer by a wet etching process after forming the trench region, thereby exposing the etch stop layer on the bottom surface of the preliminary via hole, and etching the exposed etch stop layer to form a final via hole exposing the lower interconnection.

Typically, a plasma treatment is carried out before or after the sacrificial layer is formed. Also, the capping oxide layer typically has a thickness between 10 nm and 50 nm.

BRIEF DESCRIPTION OF THE DRAWINGS

The invention is described below in relation to several embodiments illustrated in the accompanying drawings. Throughout the drawings like reference numbers indicate like exemplary elements, components, or steps. The drawings are not necessarily to scale, emphasis instead being placed upon illustrating the principles of the invention. Also, an element described as being "on" or "above" another element in a drawing is not necessarily directly on top of the other element. Indeed, there may be intervening elements between the two. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Figure 1A:
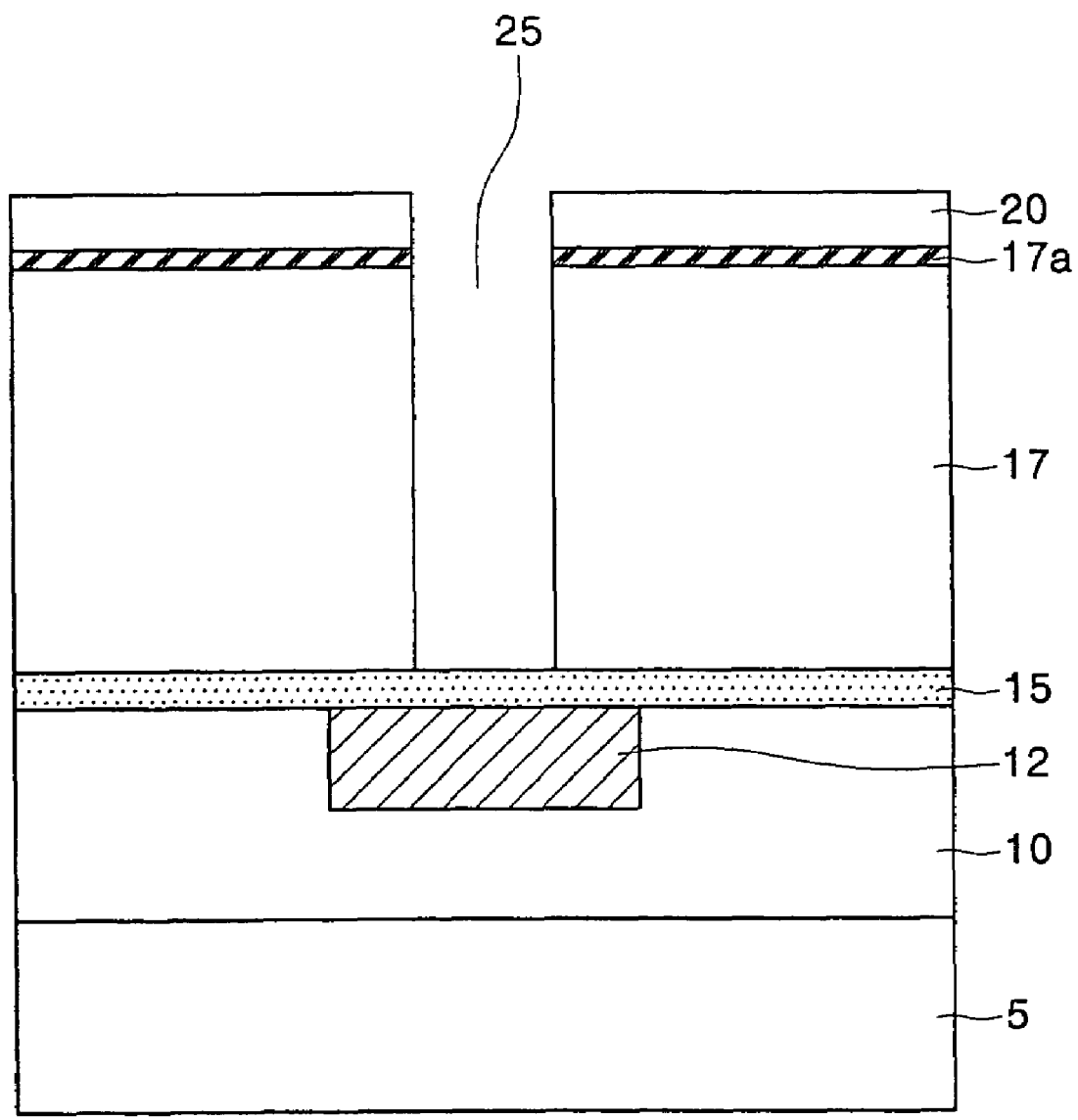
FIGS. 1A through 1F are cross-sectional views illustrating a conventional method of forming a via contact structure.
Figure 1B:
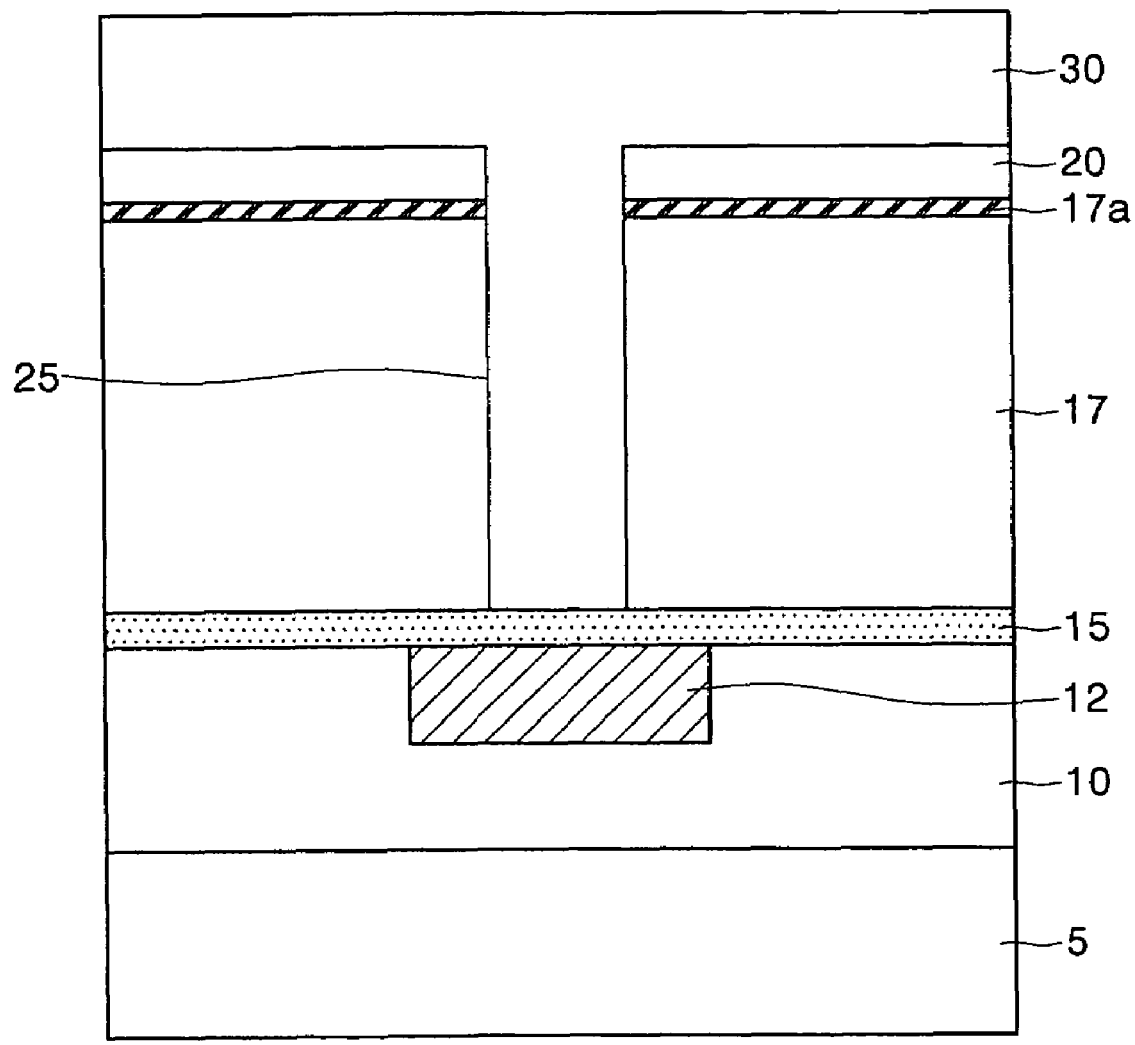
Figure 1C:
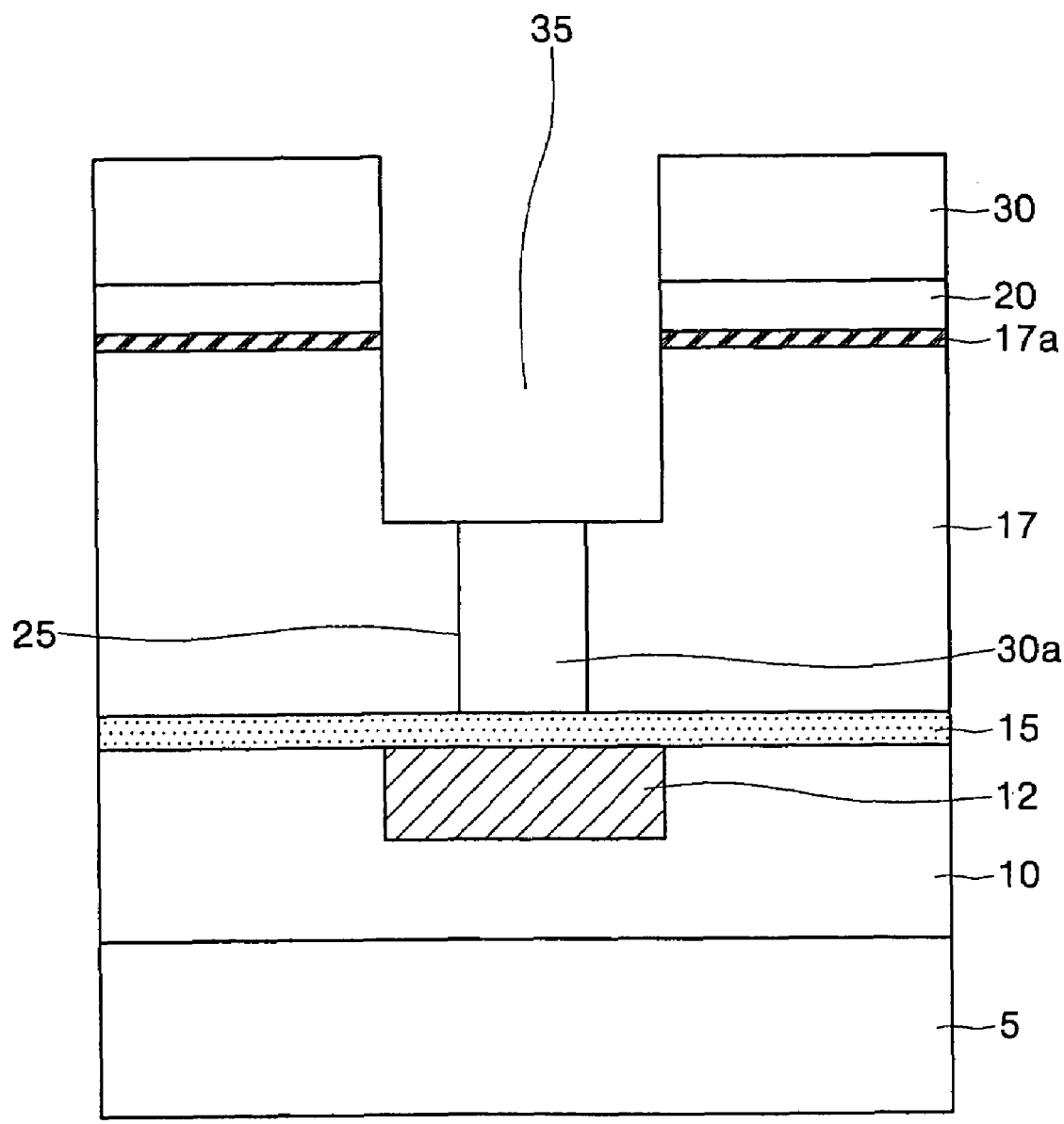
Figure 1D:
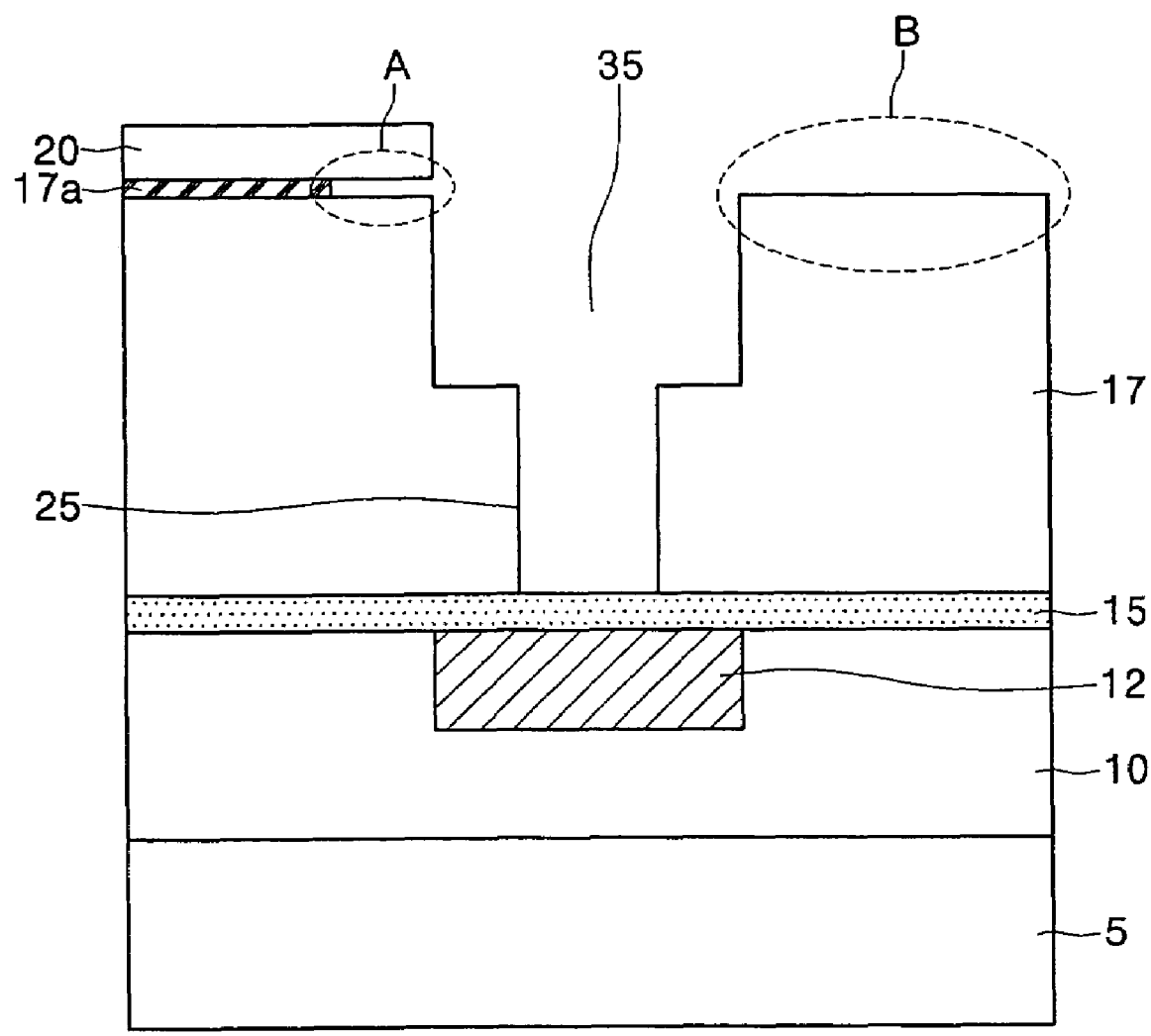
Figure 1E:
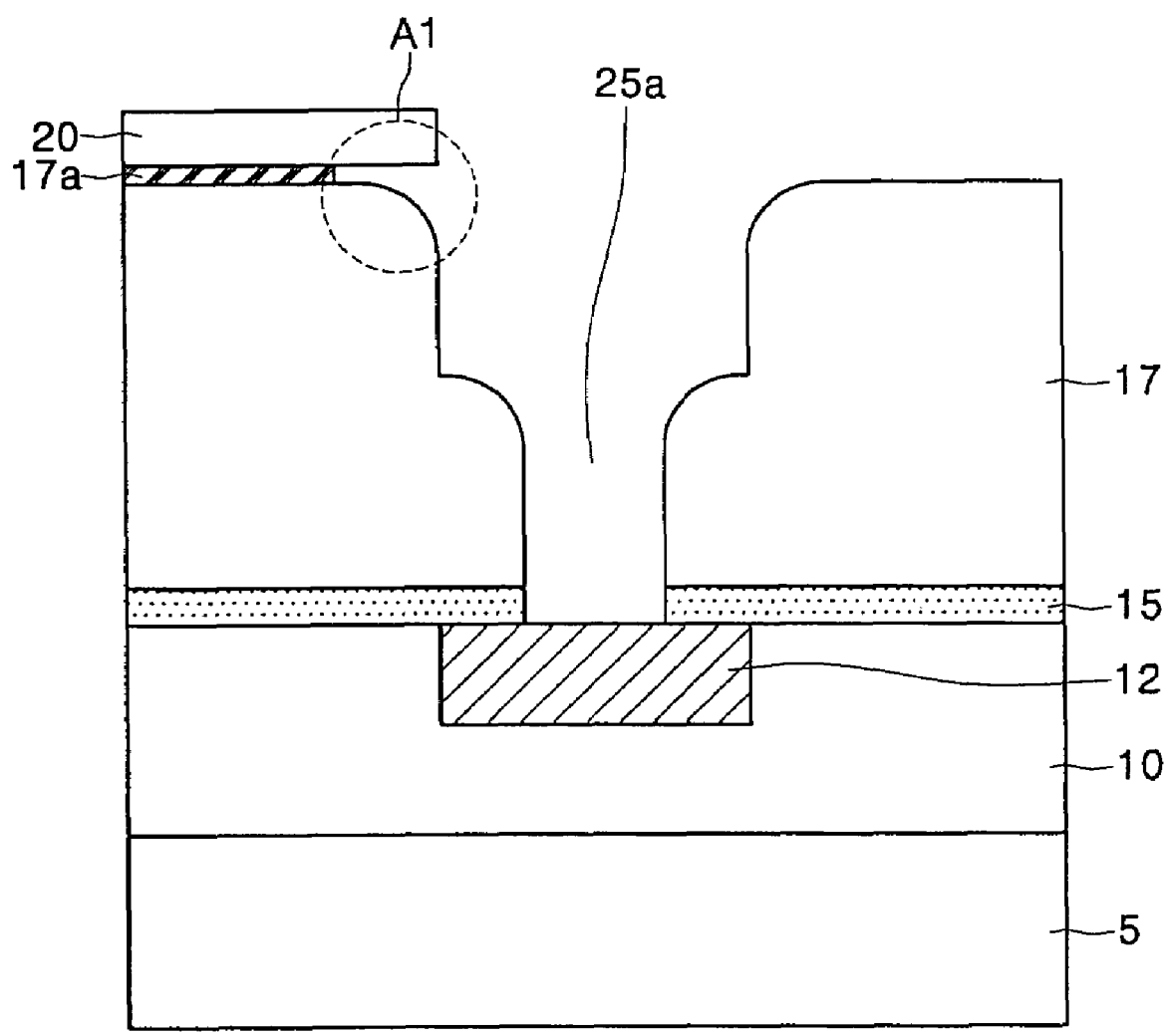
Figure 1F:
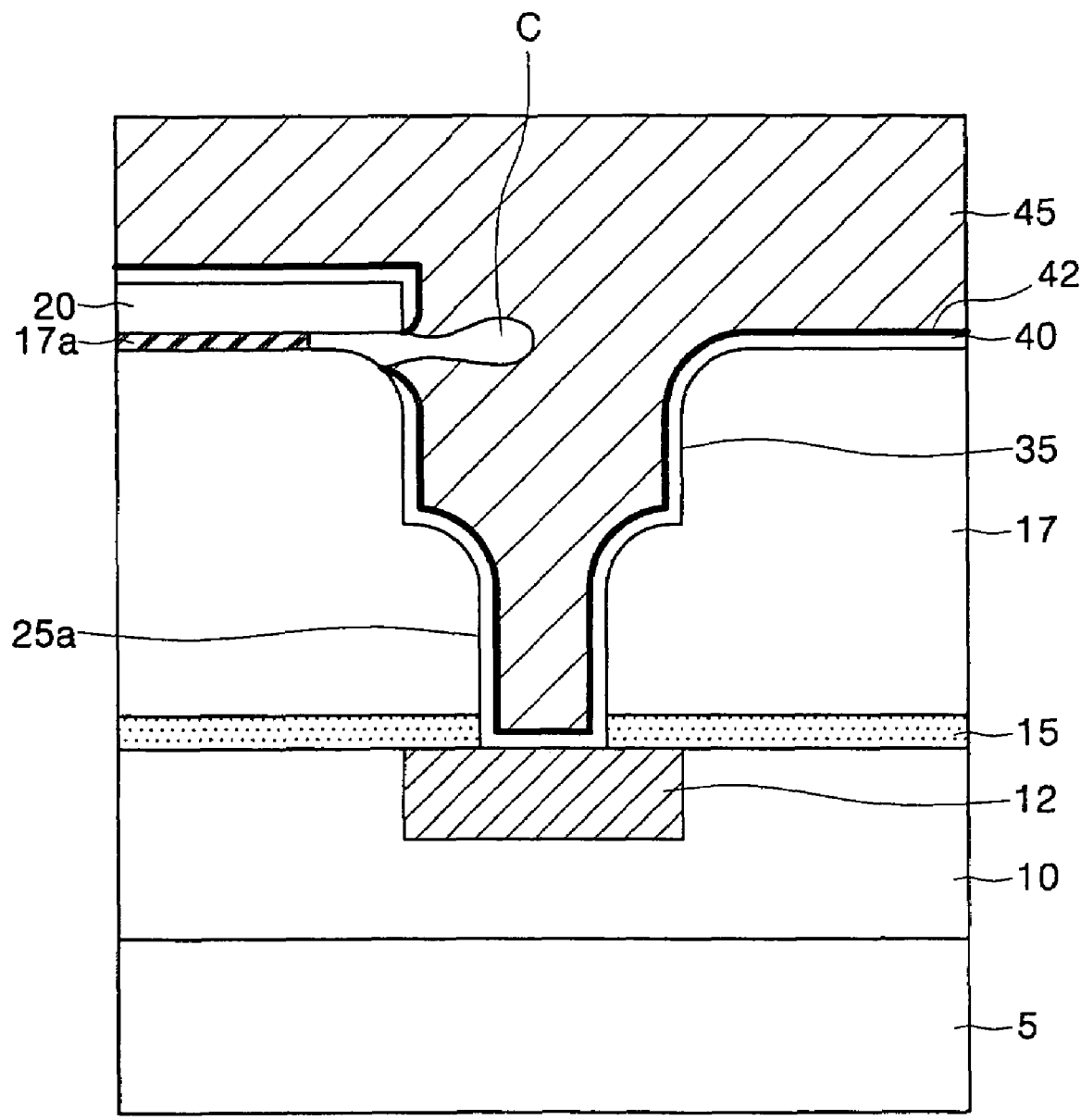
Figure 2:
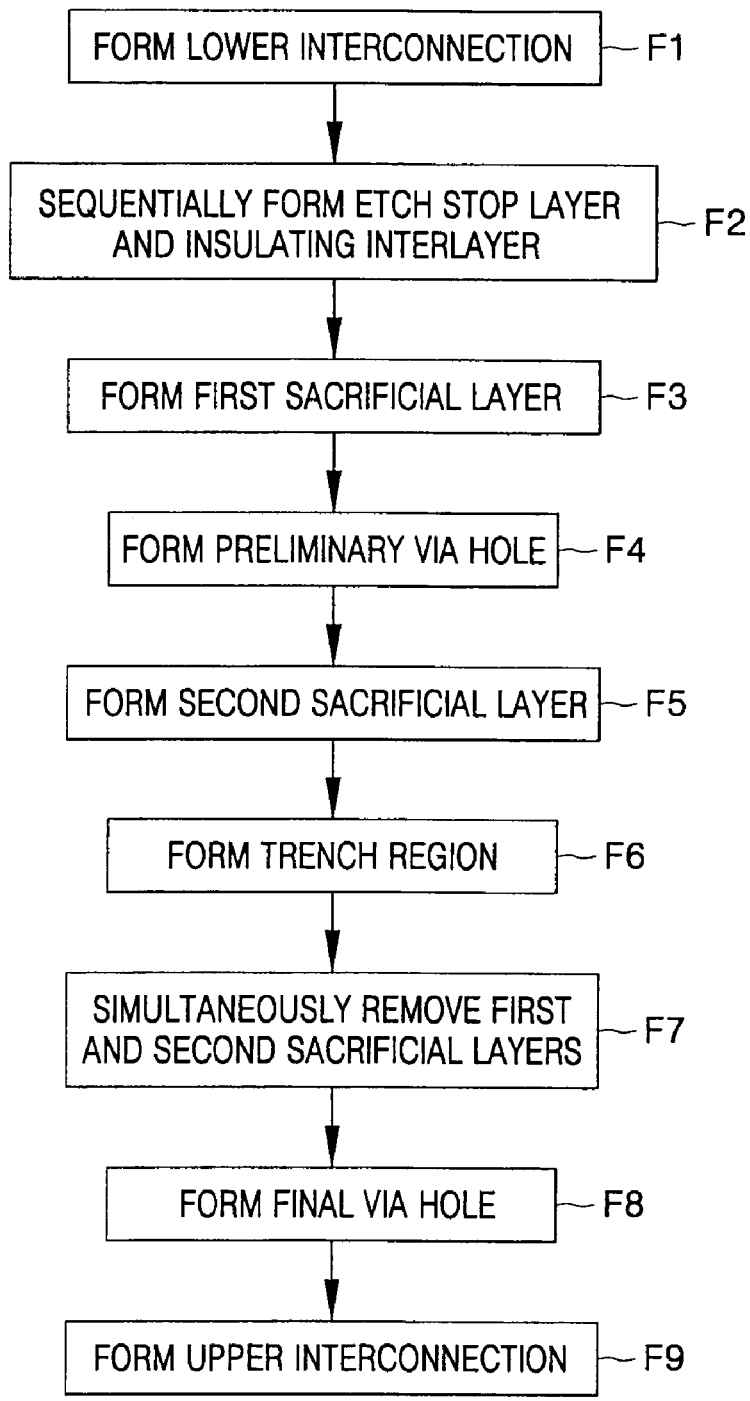
FIG. 2 is a process flow chart illustrating a method of forming a via contact structure in accordance with embodiments of the present invention.

FIG. 2 is a process flow chart illustrating a method of forming a via contact structure in a semiconductor device in accordance with embodiments of the present invention. FIGS. 3A to 3F are cross-sectional views illustrating the method.

Figure 3A:
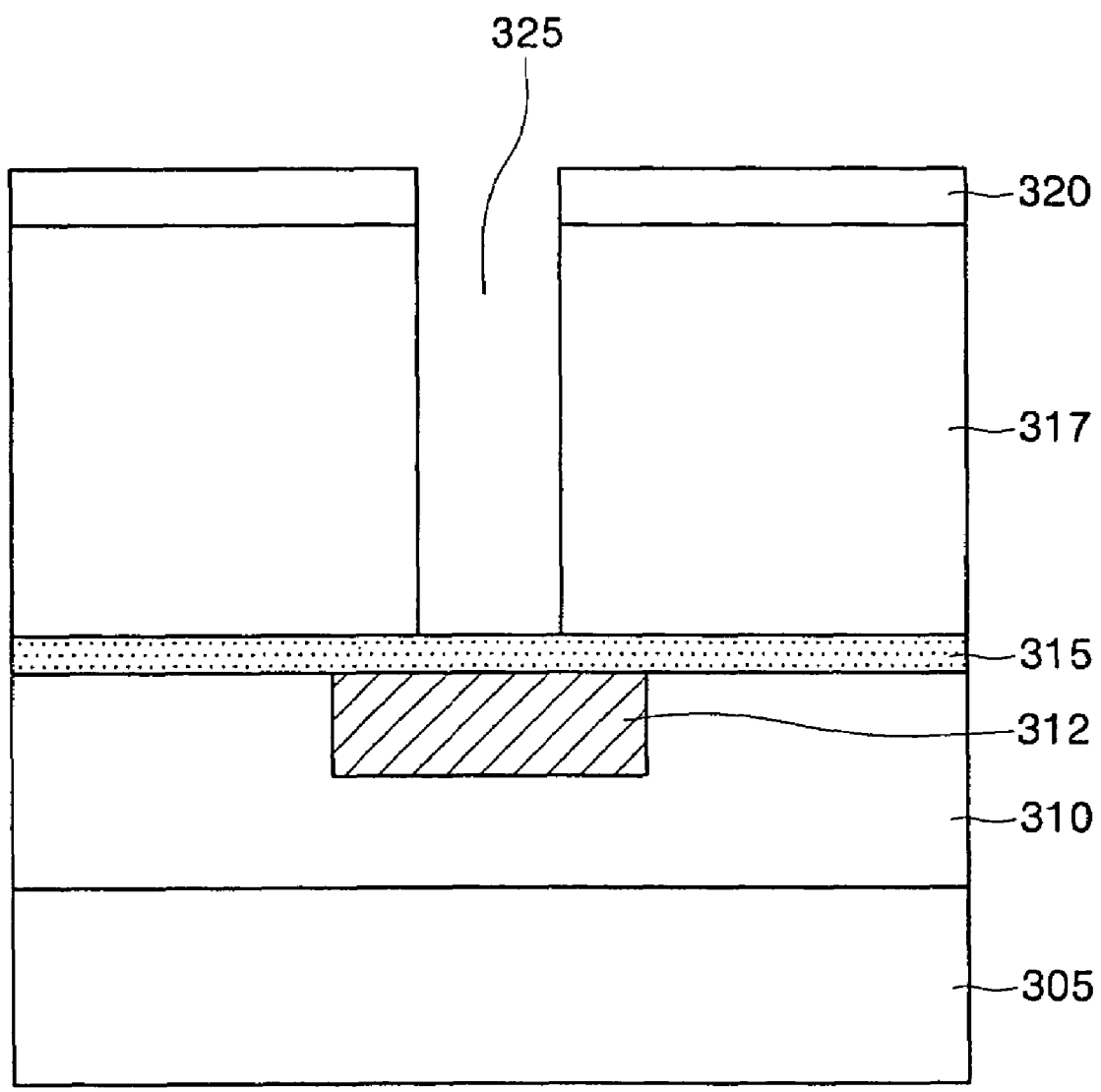
FIGS. 3A through 3F are cross-sectional views illustrating a method of forming a via contact structure in accordance with embodiments of the present invention.

Referring to FIGS. 2 and 3A, a lower insulating layer 310 is formed on a semiconductor substrate 305. A lower interconnection 312 is then formed in lower insulating layer 310 using a damascene process (See, F1 in FIG. 2). Lower interconnection 312 is typically formed of a copper layer or a tungsten layer.

An etch stop layer 315 and an insulating interlayer 317 are sequentially formed on the semiconductor substrate having lower interconnection 312 (See, F2 in FIG. 2). Etch stop layer 315 is typically formed of at least one layer selected from a group consisting of a silicon nitride (SiN) layer, a silicon carbide (SiC) layer, a silicon carbon nitride (SiCN) layer, and a benzocyclobutene (BCB) layer. Insulating interlayer 317 is preferably formed of a single low-k dielectric layer in order to improve the operating speed of the semiconductor device and to prevent an interface from forming on insulating interlayer 317. The single low-k dielectric layer is generally formed of a silicon oxide layer containing carbon, fluorine or hydrogen, such as, for example, a SiOC layer, a SIOCH layer or a SIOF layer.

Insulating interlayer 317 is commonly damaged during a subsequent process, thereby degrading its low-k dielectric characteristics. Therefore, a first sacrificial layer 320 is formed on insulating interlayer 317 in order to protect the characteristics of insulating interlayer 317 (See, F3 in FIG. 2). First sacrificial layer 320 is typically formed with a thickness between 10 nm and 300 nm. First sacrificial layer 320 is typically formed of a material layer having wet etch selectivity relative to insulating interlayer 317. In addition, first sacrificial layer 320 is preferably formed of a material layer having a dry etch rate which is higher than a dry etch rate of insulating interlayer 317. First sacrificial layer 320 is typically formed of a hydro-silses-quioxane (HSQ) layer containing hydrogen or an organosiloxane layer. First sacrificial layer 320 is typically formed using a spin-coating method.

The semiconductor substrate having insulating interlayer 317 is typically subjected to a plasma treatment before first sacrificial layer 320 is formed. The plasma treatment is carried out to facilitate coating of first sacrificial layer 320 on insulating interlayer 317 by changing a surface of insulating interlayer 317 to a hydrophilic surface. In addition, the semiconductor substrate having insulating interlayer 317 is also commonly subjected to the plasma treatment after first sacrificial layer 320 is formed. This latter plasma treatment is performed to in order to cure first sacrificial layer 320 so that it will not become separated from insulating interlayer 317 during subsequent photolithography and etching processes. The plasma treatment is typically carried out in an atmosphere containing any one gas selected from a group consisting of oxygen, nitrogen, ammonia, hydrogen, helium, and argon gases, or in an atmosphere containing at least two mixed gases selected from the group.

First sacrificial layer 320 and insulating interlayer 317 are sequentially patterned by the photolithography and etching processes to form a preliminary via hole 325 exposing a portion of etch stop layer 315 on lower interconnection 312 (See, F4 in FIG. 2). First sacrificial layer 320 serves to protect insulating interlayer 317 and also to protect corners of preliminary via hole 325.

Figure 3B:
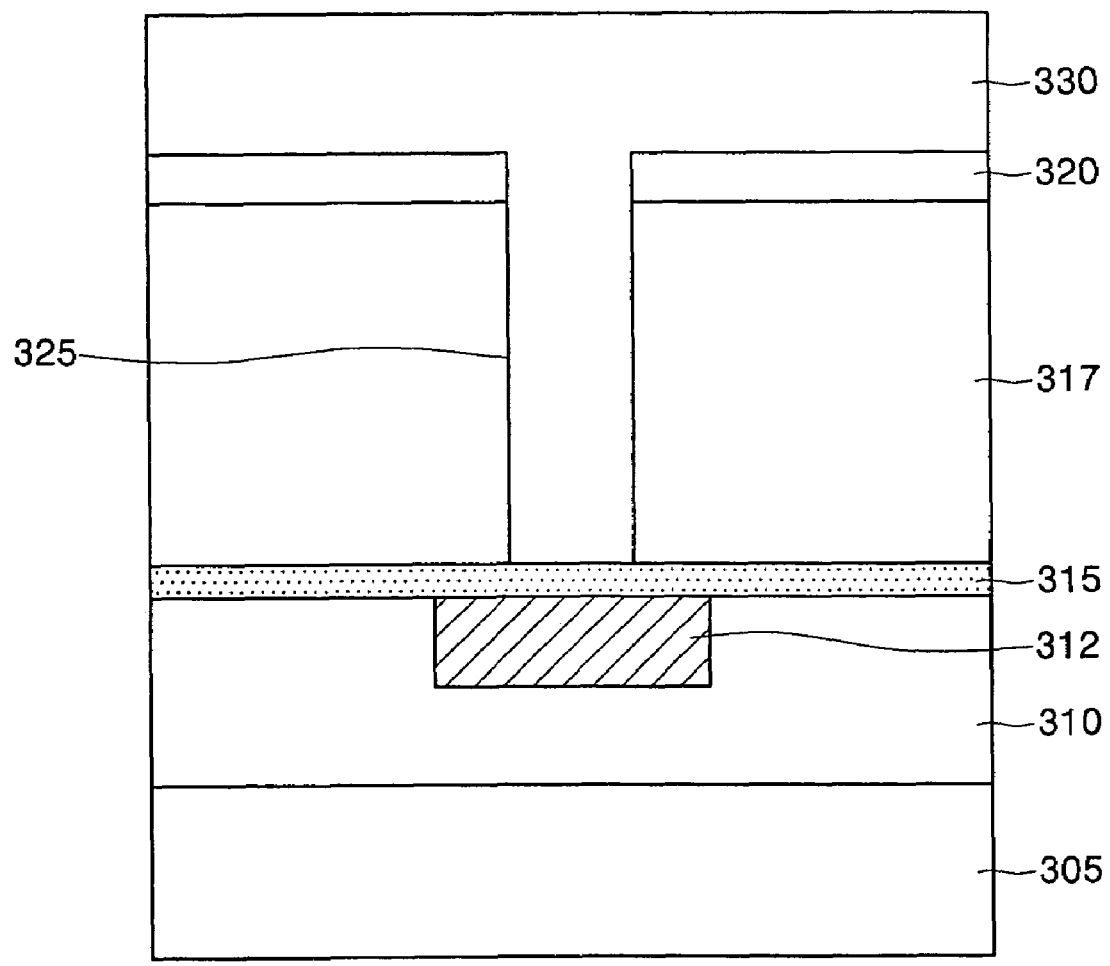

Referring to FIGS. 2 and 3B, a second sacrificial layer 330 filling preliminary via hole 325 is formed on the semiconductor substrate having preliminary via hole 325 (See, F5 in FIG. 2). Second sacrificial layer 330 preferably has the same composition as first sacrificial layer 320. Second sacrificial layer 330 is typically formed above insulating interlayer 317 with a thickness between 50 nm and 400 nm. Second sacrificial layer 330 is generally formed of a material layer having wet etch selectivity relative to insulating interlayer 317. In addition, second sacrificial layer 330 is preferably formed of a material layer having a dry etch rate which is higher than the dry etch rate of insulating interlayer 317. Second sacrificial layer 330 is typically formed of an HSQ layer containing hydrogen or an organosiloxane layer. Second sacrificial layer 330 is typically formed using a spin-coating method. Accordingly, preliminary via hole 325 is generally completely filled with second sacrificial layer 330, and second sacrificial layer 330 generally has a flat surface.

The semiconductor substrate having preliminary via hole 325 is typically subjected to a plasma treatment before second sacrificial layer 330 is formed. The plasma treatment is carried out to facilitate coating of second sacrificial layer 330 on other structures by changing a surface the semiconductor substrate having preliminary via hole 325 to a hydrophilic surface. In addition, the structure including preliminary via hole 325 is also commonly subjected to the plasma treatment after second sacrificial layer 330 is formed. in order to cure second sacrificial layer 330 after second sacrificial layer 330 is formed. This latter plasma treatment is performed in order to cure second sacrificial layer 330 so that it will not become separated from the semiconductor substrate having preliminary via hole 325 during subsequent photolithography and etching processes. The plasma treatment is typically carried out in an atmosphere containing any one gas selected from a group consisting of oxygen, nitrogen, ammonia, hydrogen, helium, and argon gases, or in an atmosphere containing at least two mixed gases selected from the group.

Figure 3C:
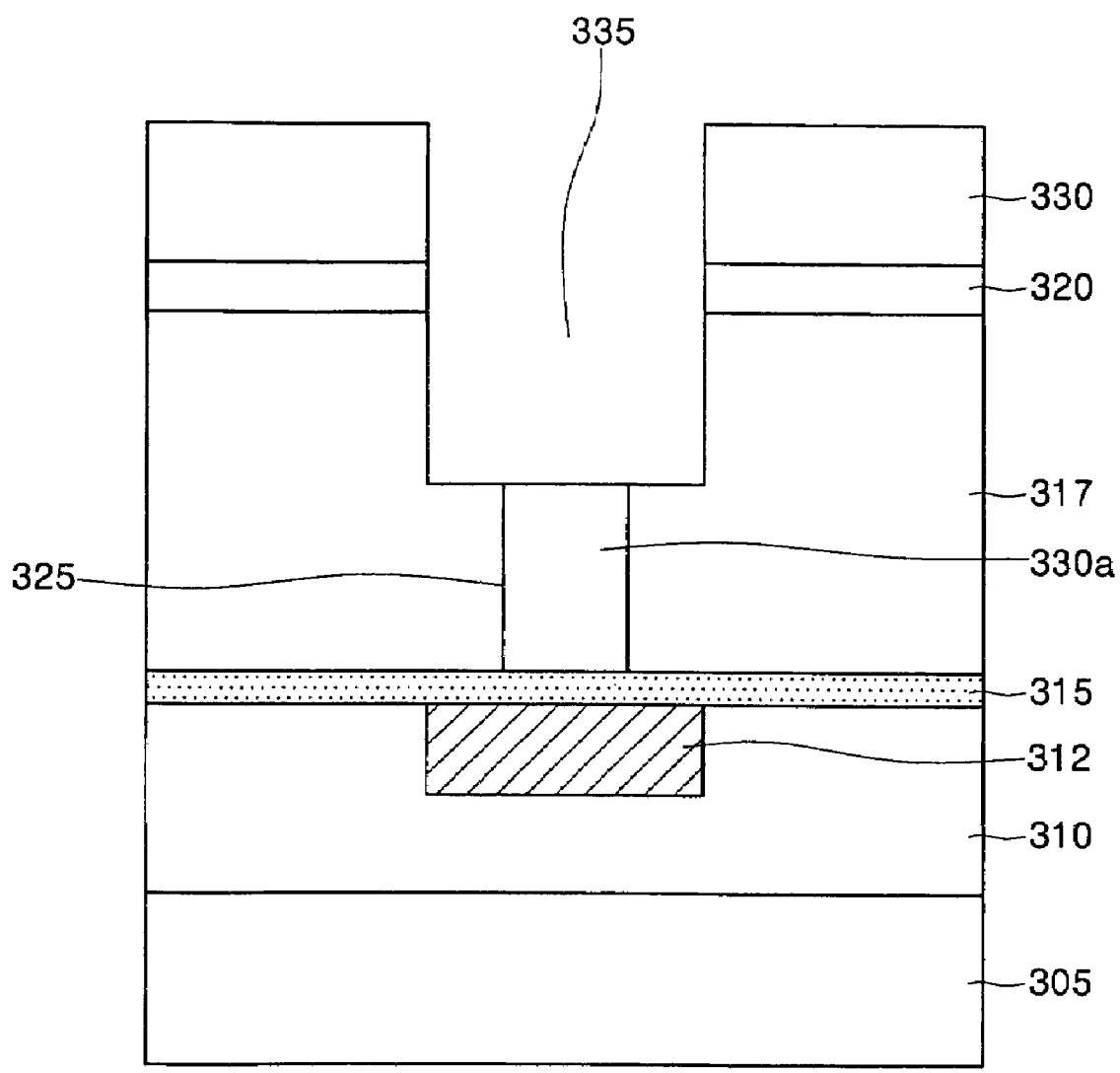

Referring to FIGS. 2 and 3C, second sacrificial layer 330, first sacrificial layer 320, and insulating interlayer 317 are sequentially patterned by the photolithography and dry etching processes to form a trench region 335 spanning preliminary via hole 325 (See, F6 in FIG. 2). Where insulating interlayer 317 is formed of a single low-k dielectric layer, trench region 335 is typically formed by partially etching insulating interlayer 317.

Second sacrificial layer 330 has a dry etch rate which is higher than the dry etch rate of insulating interlayer 317. Accordingly, second sacrificial layer 330 typically remains in preliminary via hole 325, but does not remain in trench region 335. In other words, a second sacrificial layer 330a typically remains in preliminary via hole 325.

Figure 3D:
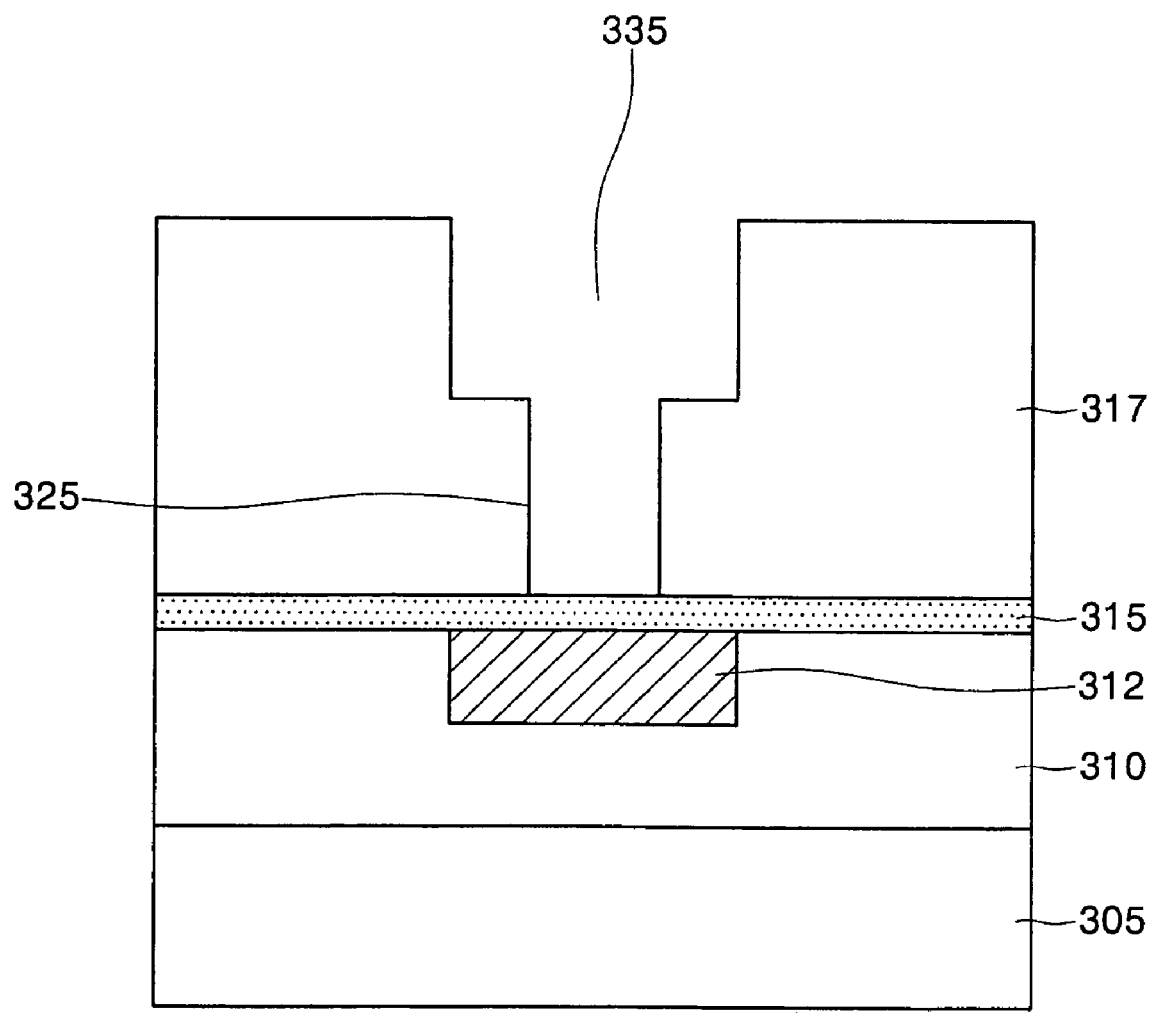

Referring to FIGS. 2 and 3D, second sacrificial layer 330a, and first and second sacrificial layers 320 and 330 are simultaneously removed by a wet etching process (See, F7 in FIG. 2). As a result, the portion of etch stop layer 315 is exposed. A solution containing hydrogen fluoride (HF) is preferably used for the wet etching. First and second sacrificial layers 320, 330, and 330a have wet etch selectivity relative to insulating interlayer 317, which prevents surfaces of insulating interlayer 317 from being etched while the wet etching is carried out.

Figure 3E:
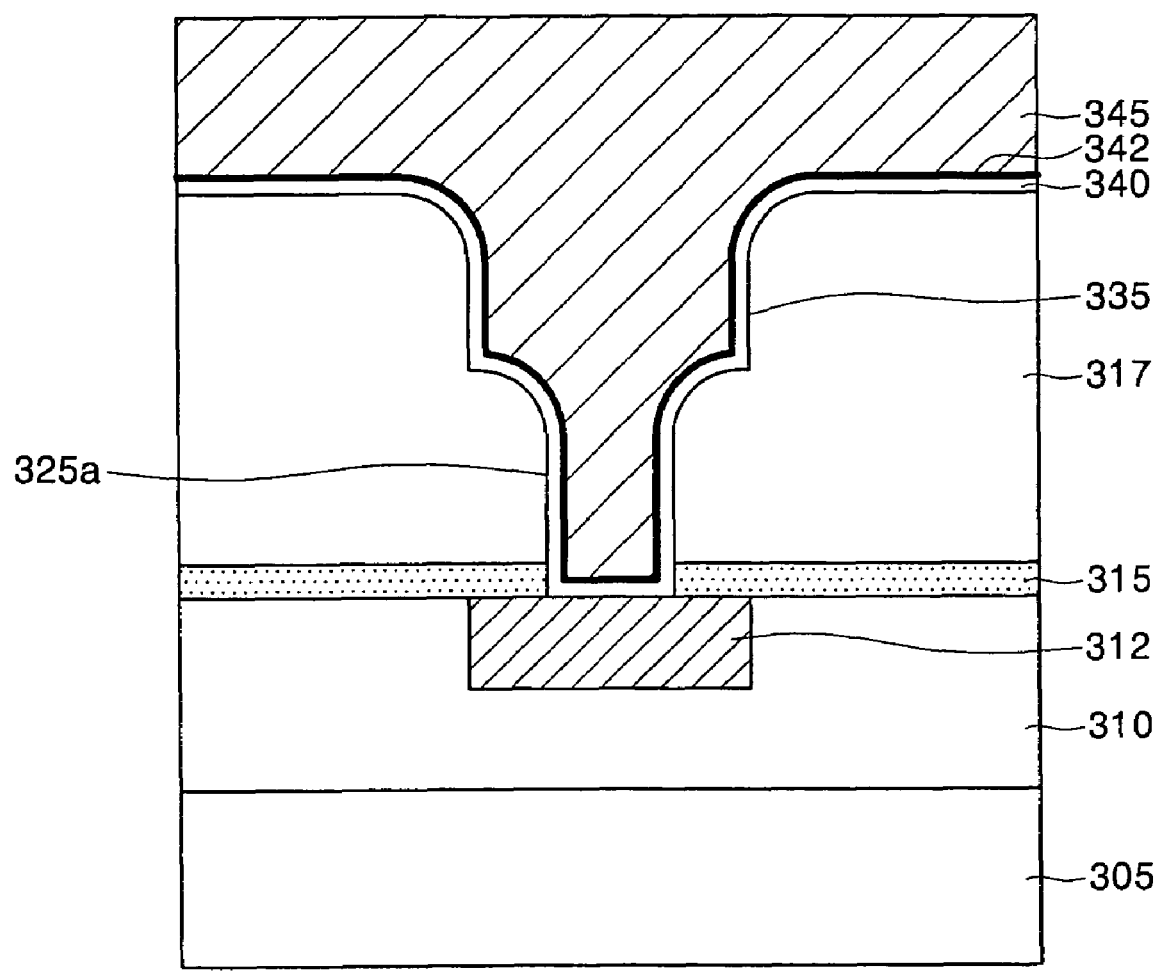

Referring to FIGS. 2 and 3E, a portion of etch stop layer 315 exposed on the bottom surface of preliminary via hole 325 is removed to form a final via hole 325a exposing lower interconnection 312 (See, F8 in FIG. 2). The portion of etch stop layer 315 is removed by dry etching. An upper metal layer is formed on the semiconductor substrate having final via hole 325a. The upper metal layer is typically formed by sequentially stacking a barrier metal layer 340 and a metal layer 345. Barrier metal layer 340 is typically formed of a TaN layer or a TiN layer, and metal layer 345 is typically formed of a copper layer. Metal layer 345 is preferably formed as follows. A copper (Cu) seed layer 342 is first formed on barrier metal layer 340 using a sputtering method, and then a chemical vapor deposition (CVD) method or a plating method is typically used to form metal layer 345. Cu seed layer 342 is uniformly formed on inner walls of trench region 335 and final via hole 325a. Metal layer 345 is uniformly formed following the formation of Cu seed layer 342, thereby allowing upper metal layer 345 to be formed in final via hole 325a and trench region 335 without any voids.

Figure 3F:
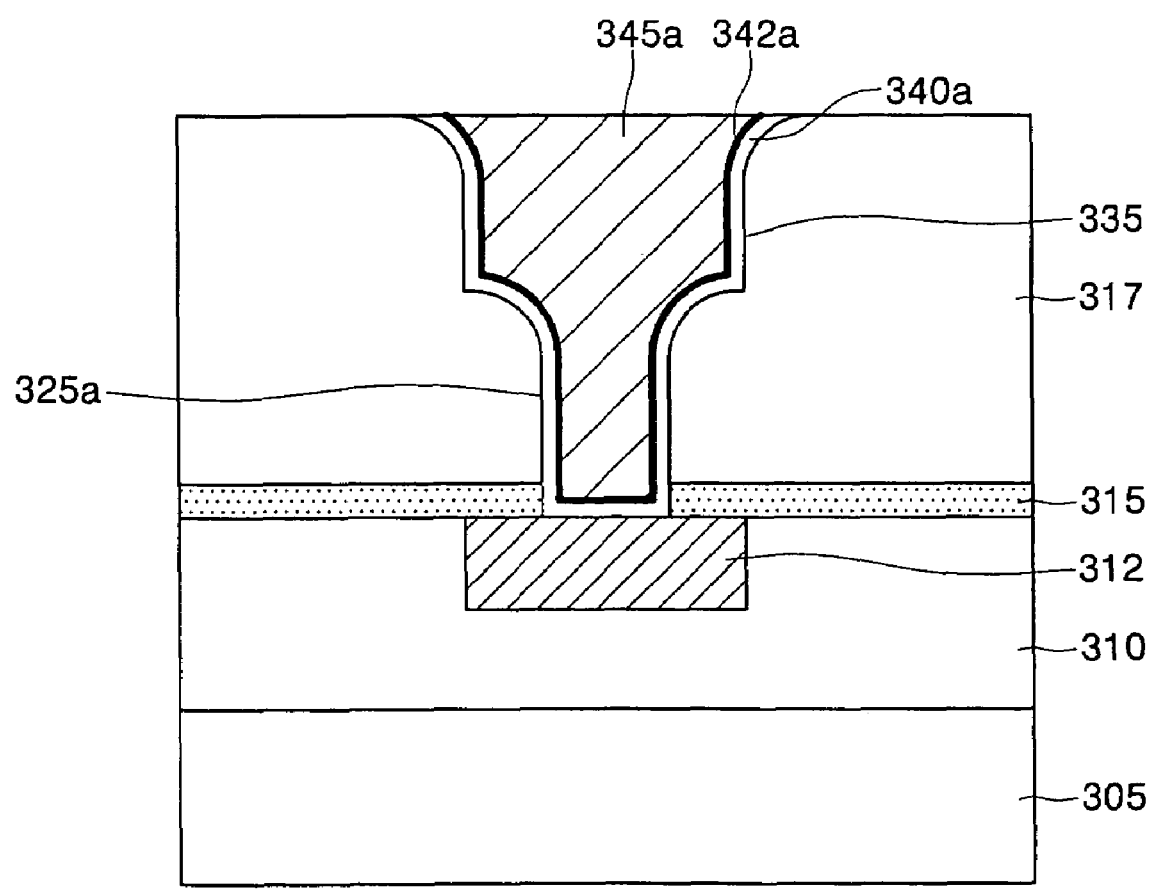

Referring to FIGS. 2 and 3F, metal layer 345, Cu seed layer 342, and barrier metal layer 340 are planarized to expose an upper surface of insulating interlayer 317. Accordingly, an upper interconnection filling trench region 335 and final via hole 325a is formed (See, F9 in FIG. 2). The upper interconnection is composed of a barrier metal layer 340a, a Cu seed layer 342a, and a metal layer 345a, which are planarized. The planarization process is typically carried out using a chemical mechanical polishing (CMP) process.

Figure 4A:
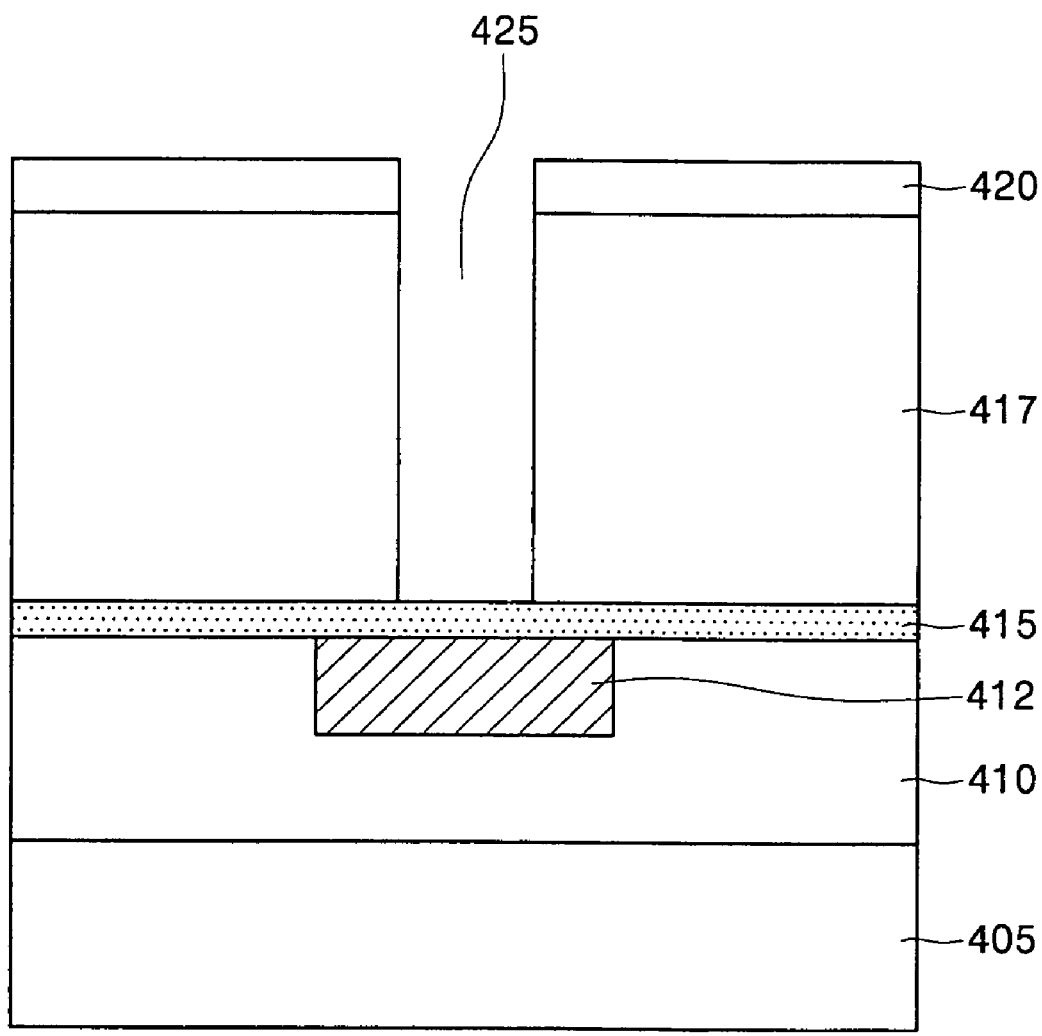
FIGS. 4A through 4C are cross-sectional views illustrating a method of forming a via contact structure in accordance with other embodiments of the present invention.
Figure 4B:
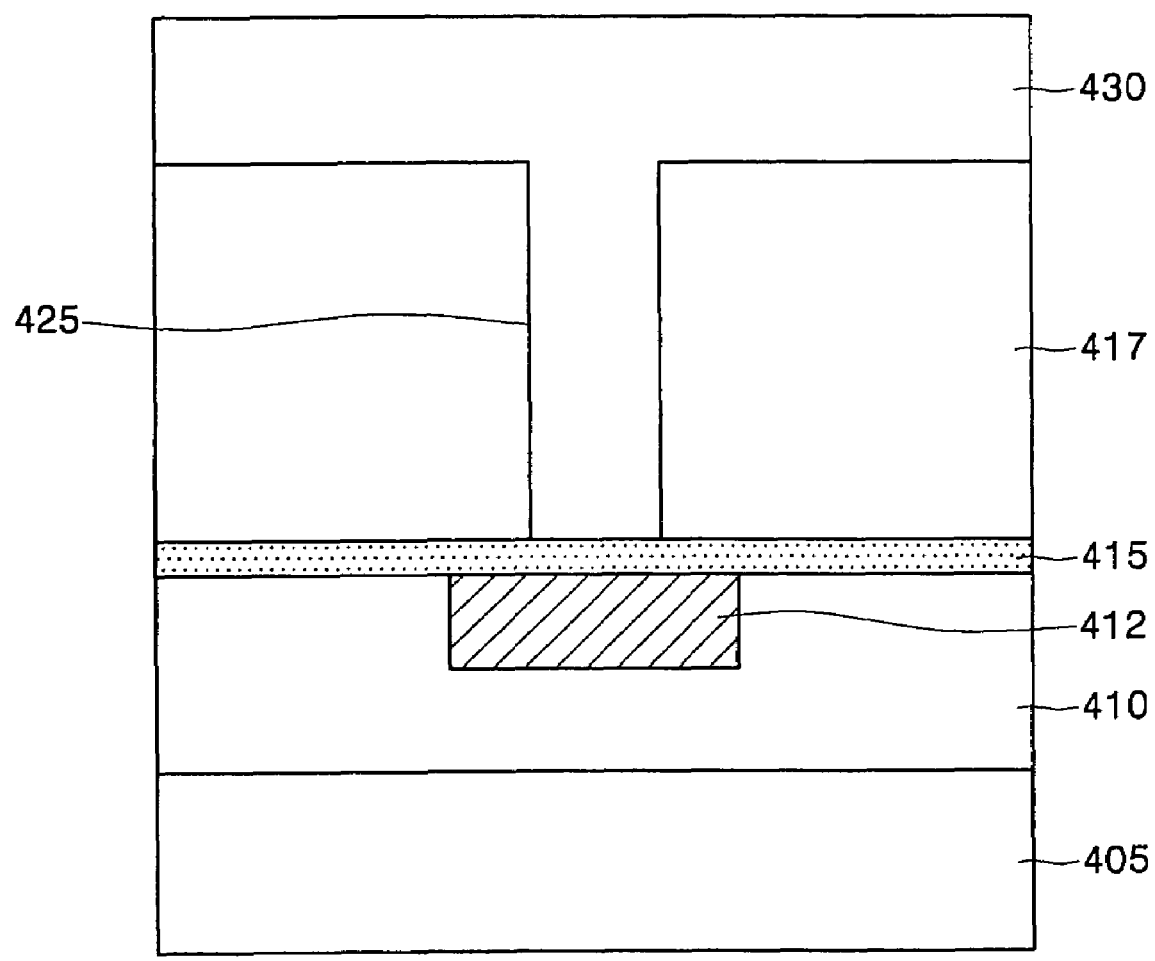
Figure 4C:
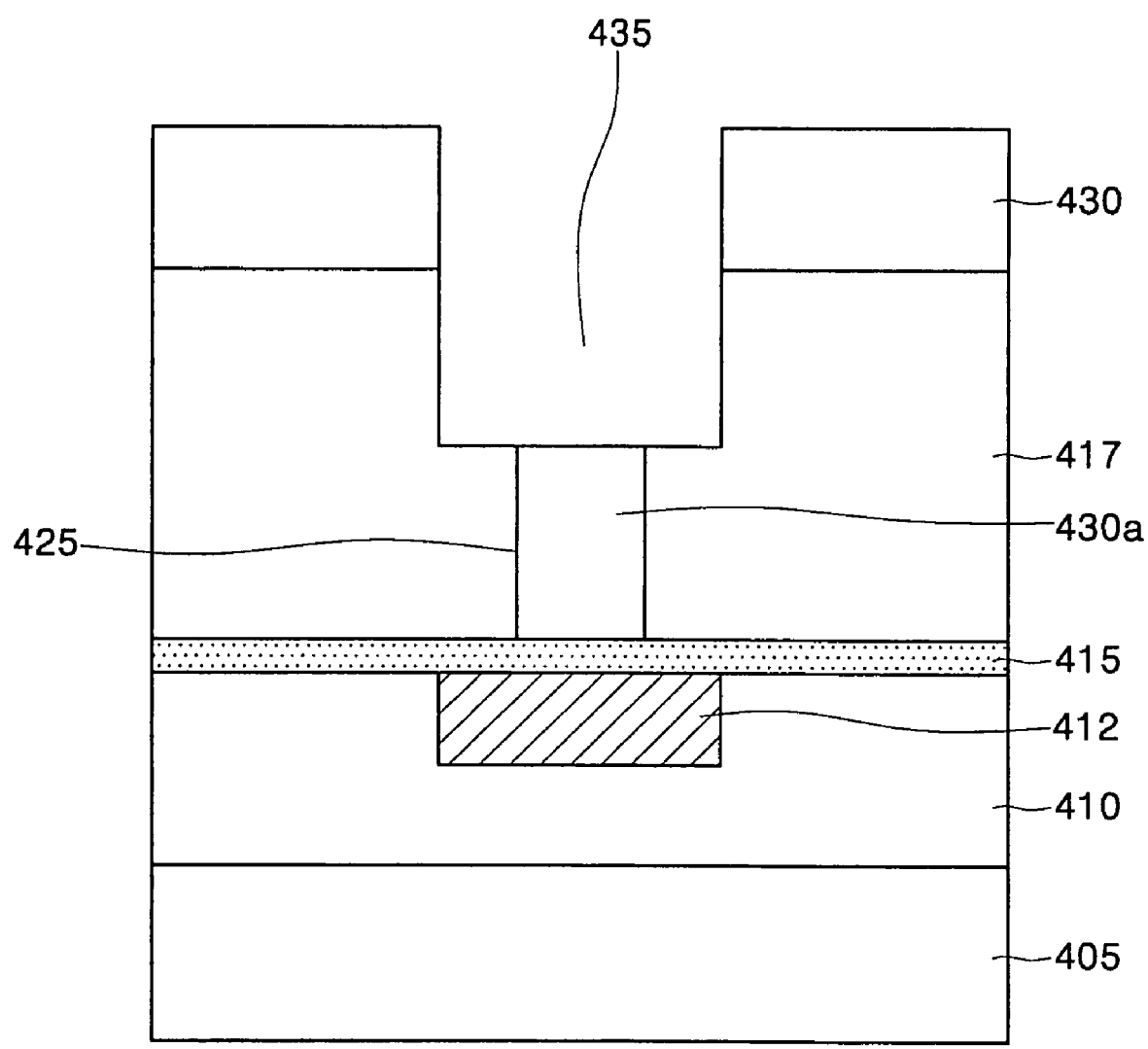

FIGS. 4A through 4C are cross-sectional views illustrating a method of forming a via contact structure in a semiconductor device in accordance with other embodiments of the present invention.

Referring to FIG. 4A, a lower insulating layer 410 is formed on a semiconductor substrate 405. A damascene process is used to form a lower interconnection 412 in lower insulating layer 410. Lower interconnection 412 is generally formed of a copper layer or a tungsten layer.

An etch stop layer 415 and an insulating interlayer 417 are sequentially formed on lower insulating layer 410. Etch stop layer 415 is typically formed of at least one layer selected from a group consisting of a SiN layer, a SiC layer, a SICN layer, and a BCB layer. Insulating interlayer 417 is preferably formed of a single low-k dielectric layer in order to enhance the operating speed of the semiconductor device and to prevent an interface from forming on insulating interlayer 417. The single low-k dielectric layer is typically formed of a silicon oxide layer containing carbon, fluorine or hydrogen, such as, for example, a SiOC layer, a SiOCH layer or a SiOF layer.

Insulating interlayer 417 is commonly damaged during a subsequent process, thereby degrading its low-k dielectric characteristics. Accordingly, a first sacrificial layer 420 is formed on insulating interlayer 417 in order to protect the characteristics thereof. First sacrificial layer 420 is typically formed with a thickness between 10 nm and 300 nm. First sacrificial layer 420 is typically formed of a material layer having wet etch selectivity relative to insulating interlayer 417. First sacrificial layer 420 is typically formed of an HSQ layer containing hydrogen or an organosiloxane layer. First sacrificial layer 420 is typically formed using a spin-coating method.

The semiconductor substrate having insulating interlayer 417 is typically subjected to a plasma treatment before first sacrificial layer 420 is formed. The plasma treatment is carried out to facilitate coating of first sacrificial layer 420 on insulating interlayer 417 by changing a surface of insulating interlayer 417 to a hydrophilic surface. In addition, the semiconductor substrate having insulating interlayer 417 is also commonly subjected to the plasma treatment after first sacrificial layer 420 is formed. This latter plasma treatment is performed to in order to cure first sacrificial layer 420 so that it will not become separated from insulating interlayer 417 during subsequent photolithography and etching processes. The plasma treatment is typically carried out in an atmosphere containing any one gas selected from a group consisting of oxygen, nitrogen, ammonia, hydrogen, helium, and argon gases, or in an atmosphere containing at least two mixed gases selected from the group.

First sacrificial layer 420 and insulating interlayer 417 are sequentially patterned by the photolithography and etching processes to form a preliminary via hole 425 exposing a portion of etch stop layer 415 on lower interconnection 412. First sacrificial layer 420 serves to protect insulating interlayer 417 and also protect corners of preliminary via hole 425.

Referring to FIG. 4B, first sacrificial layer 420 is removed by a wet etching process. A solution containing HF is preferably used for the wet etching. First sacrificial layer 420 has wet etch selectivity relative to insulating interlayer 417, which prevents surfaces of insulating interlayer 417 from being etched by the wet etching.

After first sacrificial layer 420 is removed, a second sacrificial layer 430 filling preliminary via hole 425 is formed on the semiconductor substrate having preliminary via hole 425. Second sacrificial layer 430 is typically formed using methods which are substantially the same as those described for forming second sacrificial layer 330 in FIG. 3B.

Referring to FIG. 4C, second sacrificial layer 430 and insulating interlayer 417 are sequentially patterned by the photolithography and etching processes to form a trench region 435 spanning preliminary via hole 425. Where insulating interlayer 417 is formed of a single low-k dielectric layer, trench region 435 is formed by partially etching insulating interlayer 417.

Second sacrificial layer 430 has a dry etch rate which is higher than the dry etch rate of insulating interlayer 417. Accordingly, second sacrificial layer 430 typically remains in preliminary via hole 425, but does not remain in trench region 435. In other words, a second sacrificial layer 430a remains in preliminary via hole 425.

After trench region 435 is formed, processes described with respect to FIGS. 3D through 3F are carried out to form an upper interconnection in contact with lower interconnection 412.

Figure 5:
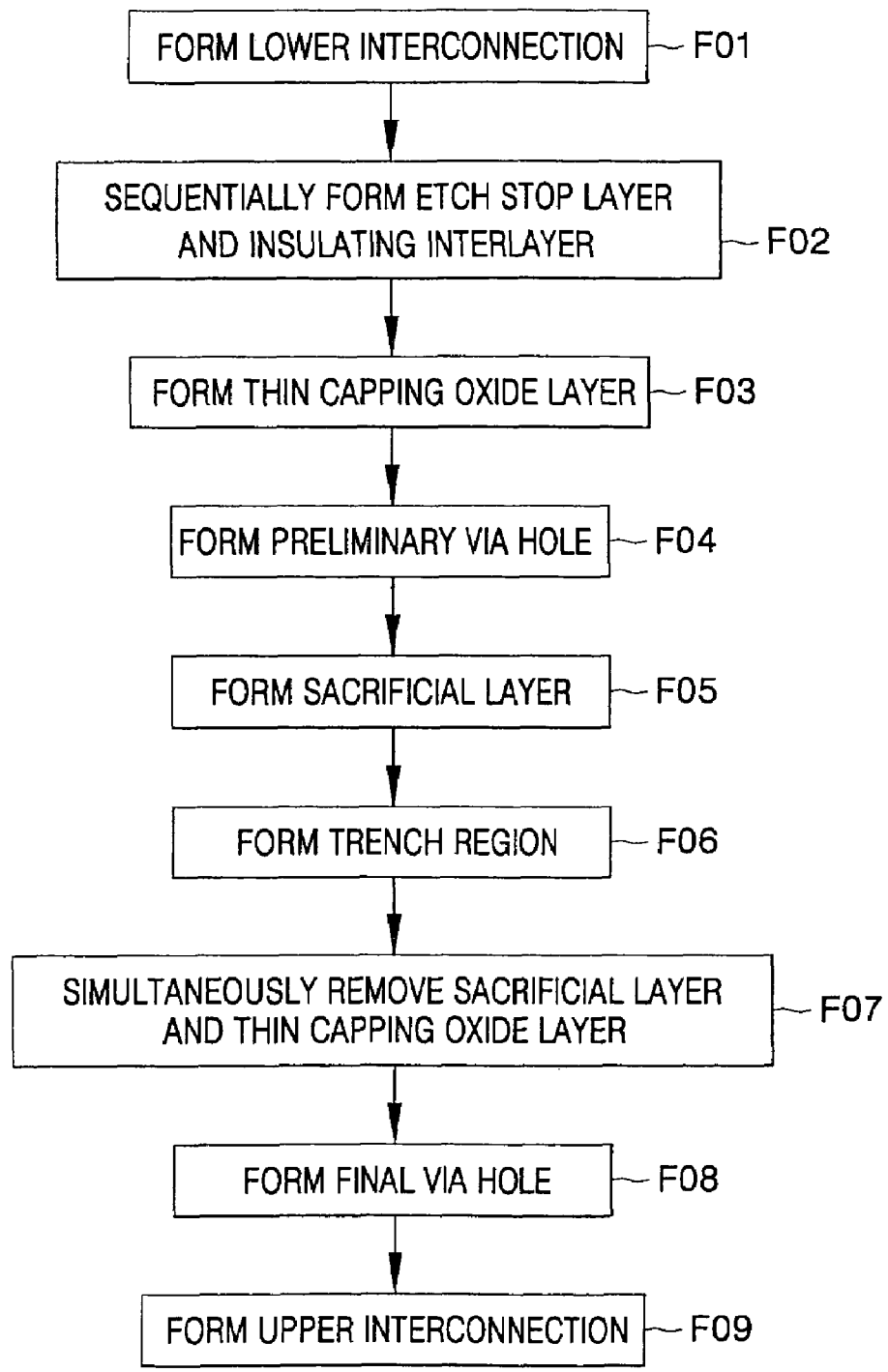
FIG. 5 is a process flow chart illustrating a method of forming a via contact structure in accordance with still other embodiments of the present invention.

FIG. 5 is a process flow chart illustrating a method of forming a via contact structure in accordance with yet other embodiments of the present invention. FIGS. 6A through 6D are cross-sectional views illustrating a method of forming a via contact structure in accordance with yet other embodiments of the present invention.

Figure 6A:
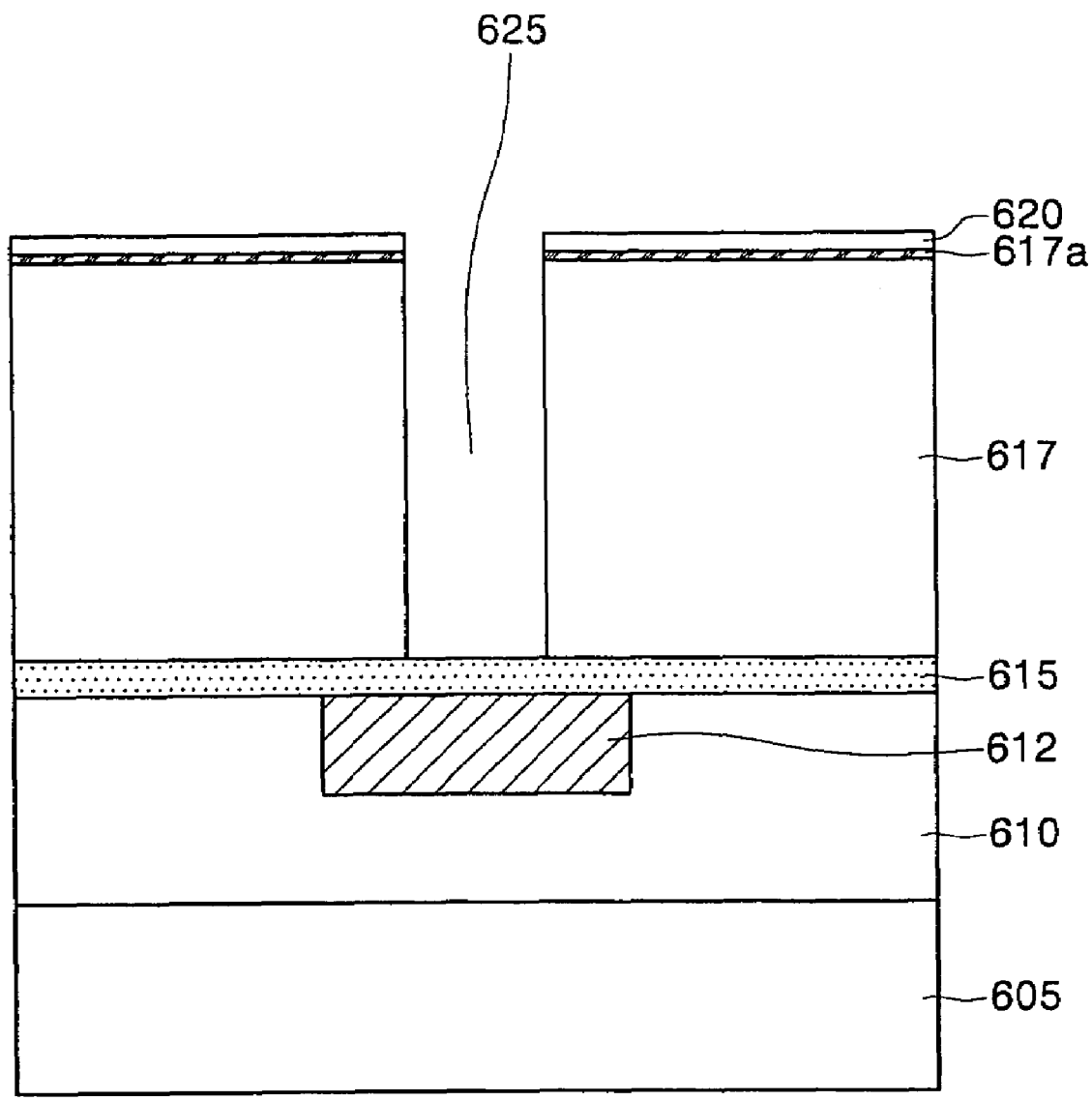
FIGS. 6A through 6D are cross-sectional views illustrating a method of forming a via contact structure in accordance with still other embodiments of the present invention.

Referring to FIGS. 5 and 6A, a lower insulating layer 610 is formed on a semiconductor substrate 605. A damascene process is used to form a lower interconnection 612 in lower insulating layer 610 (See, F01 in FIG. 5). Lower interconnection 612 is typically formed of a copper layer or a tungsten layer.

An etch stop layer 615 and an insulating interlayer 617 are sequentially formed on lower insulating layer 610 (See, F02 in FIG. 5). Etch stop layer 615 is typically formed of at least one layer selected from a group consisting of a SiN layer, a SiC layer, a SiCN layer, and a BCB layer. Insulating interlayer 617 is preferably formed of a single low-k dielectric layer in order to enhance the operating speed of the semiconductor device and to prevent an interface from forming on insulating interlayer 617. The single low-k dielectric layer is typically formed of a silicon oxide layer containing carbon, fluorine or hydrogen, such as, for example, a SiOC layer, a SiOCH layer or a SiOF layer.

Insulating interlayer 617 is commonly damaged in a subsequent process, thereby degrading its low-k dielectric characteristics. Thus, a thin capping oxide layer 620 is formed on insulating interlayer 617 in order to protect the characteristics thereof (See, F03 in FIG. 5). Because thin capping oxide layer 620 is formed in an oxygen gas atmosphere, a surface of insulating interlayer 617 which is a low-k dielectric layer is often damaged by the formation of an interface layer 617a. Where insulating interlayer 617 is formed of a SiOC layer, the oxygen gas reacts with carbon in the SiOC layer during the formation of thin capping oxide layer 620, thereby producing $CO_2$ gas. This creates interface layer 617a, which is not densely formed.

Thin capping oxide layer 620 is typically formed to have a thickness between 10 nm and 50 nm. Thin capping oxide layer 620 is typically formed of a material layer having dry etch selectivity relative to insulating interlayer 617. Alternatively, thin capping oxide layer 620 is often formed of a material layer having a wet etch selectivity relative to insulating interlayer 617. For example, thin capping oxide layer 620 is typically formed of a tetra ethyl orthosilicate (TEOS) layer. The TEOS layer is typically formed using a plasma enhanced chemical vapor deposition (PECVD) method.

Thin capping oxide layer 620 and insulating interlayer 617 are sequentially patterned by the photolithography and etching processes to form a preliminary via hole 625 exposing a portion of etch stop layer 615 on lower interconnection 612 (See, F04 in FIG. 5). Thin capping oxide layer 620 serves to protect insulating interlayer 617 and also protect corners of preliminary via hole 625.

Figure 6B:
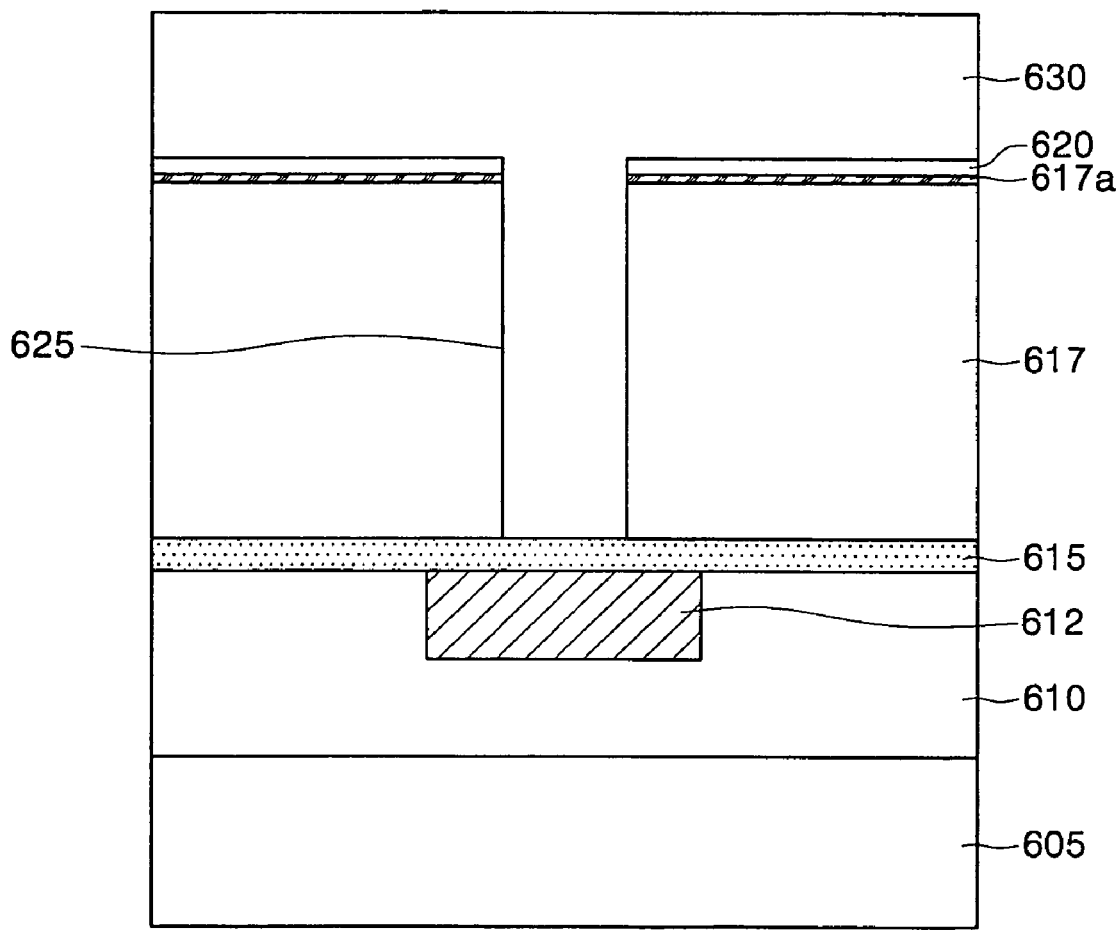

Referring to FIGS. 5 and 6B, a sacrificial layer 630 filling preliminary via hole 625 is formed on the semiconductor substrate having preliminary via hole 625 (See, F05 in FIG. 5). Sacrificial layer 630 is typically formed using methods which are substantially the same as those described with respect to the formation of second sacrificial layer 330 in FIG. 3B.

Figure 6C:
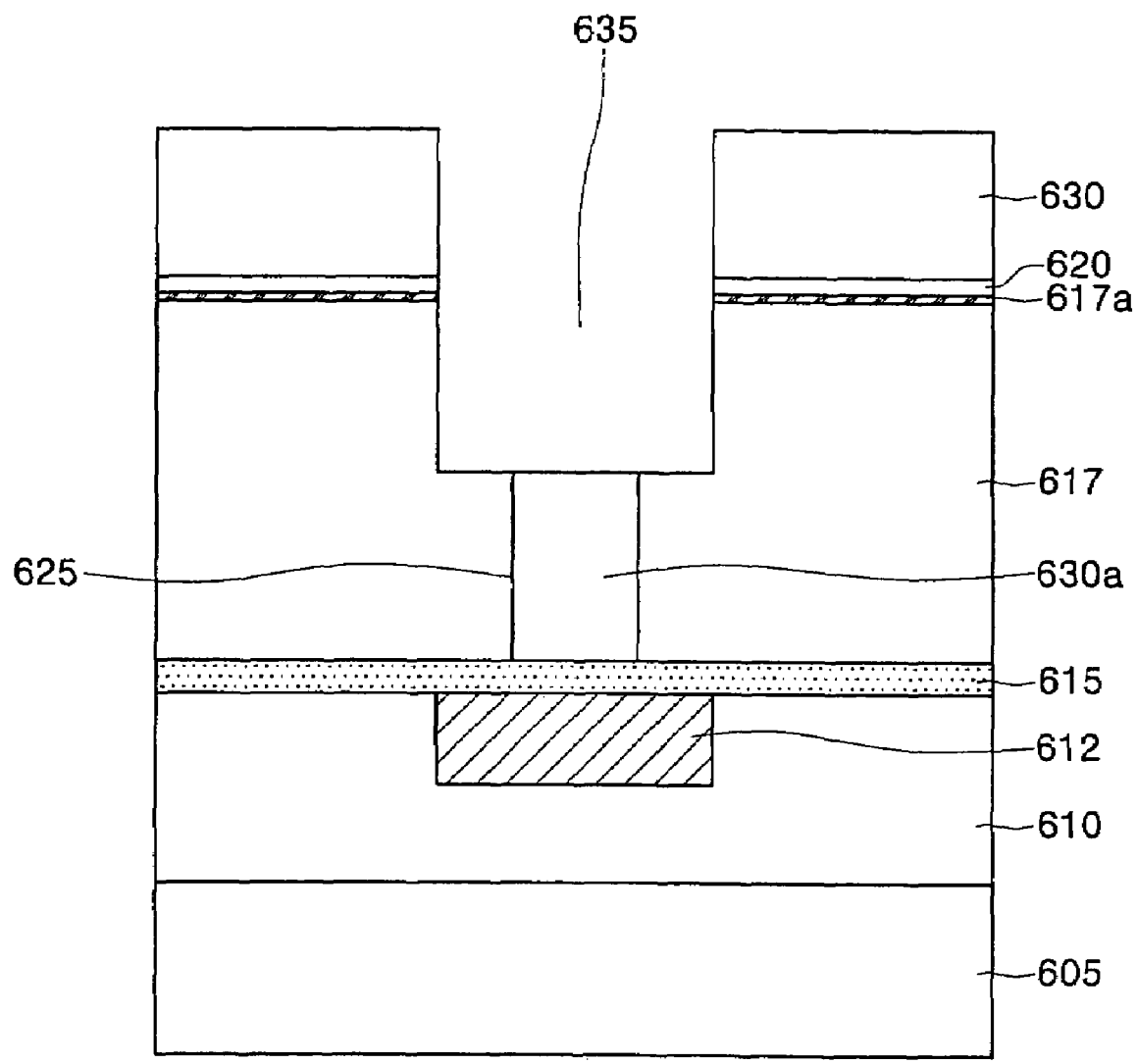

Referring to FIGS. 5 and 6C, sacrificial layer 630, thin capping oxide layer 620, interface layer 617a, and insulating interlayer 617 are sequentially patterned by the photolithography and dry etching processes to form a trench region 635 spanning preliminary via hole 625 (See, F06 in FIG. 5). Where insulating interlayer 617 is formed of a single low-k dielectric layer, trench region 635 is formed by partially etching insulating interlayer 617.

Sacrificial layer 630 has a dry etch rate which is higher than the dry etch rate of insulating interlayer 617. Accordingly, sacrificial layer 630 typically remains in preliminary via hole 625, but does not remain in trench region 635. In other words, a sacrificial layer 630a remains in preliminary via hole 625.

Figure 6D:
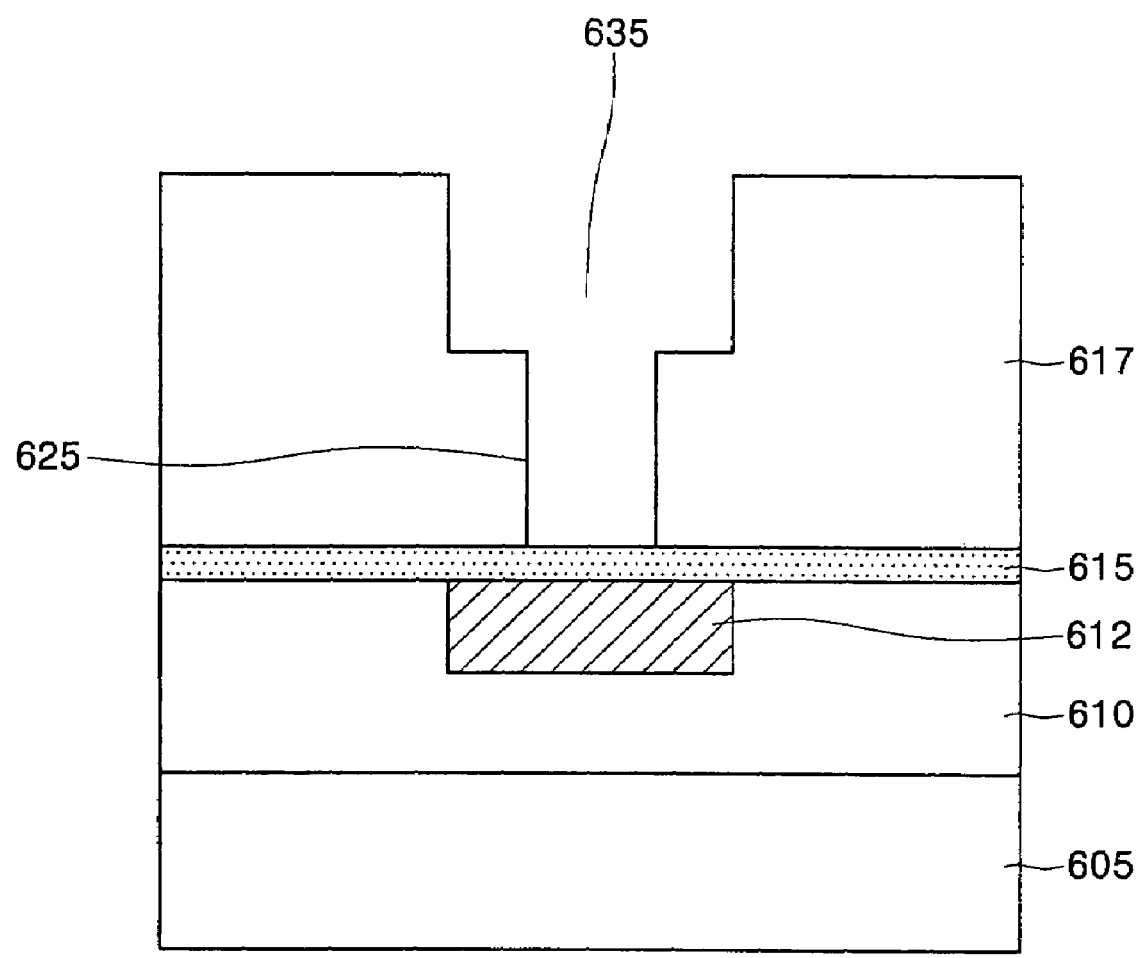

Referring to FIGS. 5 and 6D, sacrificial layer 630a in preliminary via hole 625, sacrificial layer 630 above insulating interlayer 617, thin capping oxide layer 620, and interface layer 617a are simultaneously removed by a wet etching process (See, F07 in FIG. 5). As a result, the portion of etch stop layer 615 exposed. A solution containing HF is preferably used for the wet etching. Thin capping oxide layer 620 is formed with a thickness between 10 nm and 50 nm so that it will be completely removed during the removal of sacrificial layer 630. In addition, due to certain characteristics of interface layer 617a, which is not densely formed, it is etched faster than thin capping oxide layer 620. Thin capping oxide layer 620 and sacrificial layers 630 and 630a have wet etch selectivity relative to insulating interlayer 617, which prevents surfaces of insulating interlayer 617 from being etched while the wet etching is carried out.

After trench region 635 is formed, processes described with respect to FIGS. 3E and 3F are carried out to form a final via hole (See, F08 in FIG. 5) and to form an upper interconnection (See, F09 in FIG. 5).

According to embodiments of the present invention as described above, a sacrificial layer is formed on an insulating interlayer in order to protect the insulating interlayer, which is a low-k dielectric layer, during the formation of a preliminary via hole. The sacrificial layer has the same composition as a layer filling the preliminary via hole in a subsequent trench formation process. The sacrificial layer and the layer filling the preliminary via hole are simultaneously removed after the trench formation process is carried out. Accordingly, undercut defects, which cause problems in conventional devices, do not occur. This typically prevents voids from occurring during the formation of an upper metal layer. In addition, according to other embodiments, a thin capping oxide layer is formed on an insulating interlayer in order to protect the insulating interlayer, which is a low-k dielectric layer, during the formation of a preliminary via hole. The thin capping oxide layer is formed to have a very small thickness, and is removed together with a sacrificial layer when the sacrificial layer is removed after the trench formation process is carried out. Accordingly, undercut defects that have created problems in conventional devices do not occur, which prevents voids from occurring when an upper metal layer is formed.

What is claimed is:

1. A method of forming a via contact structure, the method comprising:
    forming a lower interconnection on a semiconductor substrate;
    sequentially forming an etch stop layer, an insulating interlayer, and a first sacrificial layer on the semiconductor substrate;
    sequentially patterning the first sacrificial layer and the insulating interlayer to form a preliminary via hole exposing a portion of the etch stop layer on the lower interconnection;
    forming a second sacrificial layer on the semiconductor substrate, the second sacrificial layer filling the preliminary via hole;
    sequentially patterning the second sacrificial layer, the first sacrificial layer, and the insulating interlayer to form a trench region spanning the preliminary via hole;
    simultaneously removing the first and second sacrificial layers using a wet etching process after forming the trench region, thereby exposing the portion of the etch stop layer; and,
    etching the exposed portion of the etch stop layer, thereby exposing the lower interconnection.

2. The method as recited in claim 1, wherein the insulating interlayer is formed of a single low-k dielectric layer selected from a group consisting of a SiOC layer, a SiOCH layer, and a SiOF layer.

3. The method as recited in claim 1, wherein the first and second sacrificial layers have the same composition.

4. The method as recited in claim 1, wherein the first and second sacrificial layers are formed of a material layer having wet etch selectivity relative to the insulating interlayer.

5. The method as recited in claim 1, wherein the first and second sacrificial layers are formed of a material having a dry etch rate which is higher than the dry etch rate of the insulating interlayer.

6. The method as recited in claim 1, wherein each of the first and second sacrificial layers is formed by a hydro-silses-quioxane (HSQ) layer containing hydrogen or an organosiloxane layer.

7. The method as recited in claim 6, wherein the first and second sacrificial layers are formed by a spin-coating method.

8. The method as recited in claim 1, wherein a plasma treatment is carried out before or after forming the first sacrificial layer or the second sacrificial layer.

9. The method as recited in claim 8, wherein the plasma treatment is carried out in an atmosphere containing at least one gas selected from a group consisting of oxygen, nitrogen, ammonia, hydrogen, helium, and argon gases, or in an atmosphere containing at least two mixed gases selected from the group.

10. The method as recited in claim 1, wherein the wet etching is carried out using a solution containing hydrogen fluoride (HF).

11. The method as recited in claim 1, wherein the first sacrificial layer is formed with a thickness between 10 nm and 300 nm.

12. The method as recited in claim 1, wherein the second sacrificial layer is formed above the insulating interlayer with a thickness between 50 nm and 400 nm.

13. A method of forming a via contact structure, the method comprising:
    forming a lower interconnection on a semiconductor substrate;
    sequentially forming an etch stop layer, an insulating interlayer, and a capping oxide layer on the semiconductor substrate;
    sequentially patterning the capping oxide layer and the insulating interlayer to form a preliminary via hole exposing a portion of the etch stop layer on the lower interconnection;

forming a sacrificial layer on the semiconductor substrate, the sacrificial layer filling the preliminary via hole;

sequentially patterning the sacrificial layer, the capping oxide layer, and the insulating interlayer to form a trench region spanning the preliminary via hole;

simultaneously removing the capping oxide layer and the sacrificial layer using a wet etching process after forming the trench region, thereby exposing the portion of the etch stop layer; and, etching the exposed portion of the etch stop layer to form a final via hole exposing the lower interconnection.

14. The method as recited in claim 13, wherein the insulating interlayer is formed of a single low-k dielectric layer selected from a group consisting of a SiOC layer, a SiOCH layer, and a SiOF layer.

15. The method as recited in claim 13, wherein the capping oxide layer is formed of a material layer having wet etch selectivity relative to the insulating interlayer.

16. The method as recited in claim 13, wherein the sacrificial layer is formed of a material layer having wet etch selectivity relative to the insulating interlayer.

17. The method as recited in claim 13, wherein the sacrificial layer is formed of a material layer having a dry etch rate which is higher than the dry etch rate of the insulating interlayer.

18. The method as recited in claim 13, wherein the sacrificial layer is formed by a hydro-silses-quioxane (HSQ) layer containing hydrogen or an organosiloxane layer.

19. The method as recited in claim 18, wherein the sacrificial layer is formed using a spin-coating method.

20. The method as recited in claim 13, wherein a plasma treatment is carried out before or after forming the sacrificial layer.

21. The method as recited in claim 20, wherein the plasma treatment is carried out in an atmosphere containing any one gas selected from a group consisting of oxygen, nitrogen, ammonia, hydrogen, helium, and argon gases, or in an atmosphere containing at least two mixed gases selected from the group.

22. The method as recited in claim 13, wherein the wet etching is carried out using a solution containing HF.

23. The method as recited in claim 13, wherein the capping oxide layer is formed of a tetra ethyl orthosilicate (TEOS) layer.

24. The method as recited in claim 23, wherein the TEOS layer is formed by a plasma enhanced chemical vapor deposition (PECVD) method.

25. The method as recited in claim 13, wherein the sacrificial layer is formed above the insulating interlayer with a thickness between 50 nm and 400 nm.

26. The method as recited in claim 13, wherein the capping oxide layer has a thickness between 10 nm and 50 nm.

* * * * *